United States Patent [19]
Suwa et al.

[11] Patent Number: 6,062,099
[45] Date of Patent: May 16, 2000

[54] ROBOT FOR HANDLING

[75] Inventors: Tatsunori Suwa; Kazuhiro Hatake, both of Hiratsuka, Japan

[73] Assignee: Komatsu Ltd., Tokyo, Japan

[21] Appl. No.: 09/077,827

[22] PCT Filed: Jan. 30, 1997

[86] PCT No.: PCT/JP97/00225

§ 371 Date: Jun. 4, 1998

§ 102(e) Date: Jun. 4, 1998

[87] PCT Pub. No.: WO97/27977

PCT Pub. Date: Aug. 7, 1997

[30] Foreign Application Priority Data

Feb. 2, 1996 [JP] Japan .................................. 8-039136
Mar. 15, 1996 [JP] Japan .................................. 8-086062
Mar. 29, 1996 [JP] Japan .................................. 8-076038

[51] Int. Cl.[7] .................................................. G05G 11/00
[52] U.S. Cl. ................................ 74/490.01; 74/490.03; 901/23
[58] Field of Search ........................ 74/490.01, 490.02, 74/490.03; 901/23, 19

[56] References Cited

U.S. PATENT DOCUMENTS 5,771,748 6/1998 Genov et al. ........................ 74/490.03
5,879,127 3/1999 Grunes et al. ...................... 74/490.03
5,894,760 4/1999 Caveney ............................. 74/490.03

FOREIGN PATENT DOCUMENTS

| 57-173487 | 10/1982 | Japan . |
| 62-277228 | 12/1987 | Japan . |
| 1-74081 | 5/1989 | Japan . |
| 1-120336 | 8/1989 | Japan . |
| 2-83182 | 3/1990 | Japan . |
| 3-136779 | 6/1991 | Japan . |
| 4-271287 | 9/1992 | Japan . |

OTHER PUBLICATIONS

WO97/27977, Entire Document, Aug. 7, 1997.

Primary Examiner—Tamara L. Graysay
Assistant Examiner—David Fenstermacher
Attorney, Agent, or Firm—Wenderoth, Lind & Ponack, L.L.P.

[57] ABSTRACT

A robot for handling comprises at least four bosses (20a, 20b, 20c, 20d) coaxially provided and displaced from each other axially of the center of rotation to permit independent rotation, arms (21a, 21b, 21c, 21d) provided on the bosses, respectively, links (22a, 22b, 22c, 22d) connected to the respective arms, a plurality of carriages (8a, 8b) connected through a carriage attitude regulating mechanism (B) to tip ends of each pair of links, each of which is connected to each arm of each pair of axially adjacent two bosses, the plurality of carriages being displaced from each other axially of the center of rotation, and independent drive sources (27a, 27b, 27c, 27d), respectively, connected to each of said bosses.

19 Claims, 30 Drawing Sheets

ROBOT FOR HANDLING

TECHNICAL FIELD

The present invention relates to a handling robot in a multiple chamber type manufacturing system such as a semiconductor manufacturing system and an LCD manufacturing system, in which a plurality of process chambers are disposed around a single transfer chamber to constitute a like plurality of stations, and in which a workpiece in the form of a thin plate such as a wafer that is to be machined and processed in each of the process chambers is, in a clean state or an evacuated (low pressure) state, conveyed by the said handling robot that is arranged in the transfer chamber, via the said transfer chamber from one of the said process chambers to another.

BACKGROUND ART

A multiple chamber type semiconductor manufacturing system is constructed as shown in FIG. 1 of the drawings attached hereto and has a plurality of process chamber stations 2a, 2b, 2c, 2d and 2e disposed around a transfer chamber 1 and also has arranged therein a pair of workpiece delivery stations 3 by each of which the workpiece is delivered to an outside thereof, and in which the space within the transfer chamber 1 is kept in an evacuated state by a suction unit.

And, the above mentioned transfer chamber 1 is constructed as shown in FIG. 2 of the drawings attached hereto and has a handling robot A provided at a central region thereof so as to be rotatable. It also is provided with a plurality of partition walls 5 that serve as the peripheral walls thereof with each wall opposing to each of the said stations 2a, 2b, 2c, 2d and 2e and the said workpiece delivery stations 3 and in which there are also provided a plurality of gates 56 each of which constitutes both an inlet and an outlet for the workpiece to be fed into and out of each of the said stations. Each such gate 6 is configured so as to be opened and closed by an opening and closing door (not shown) that is disposed in opposition to each of the said gates 6.

As the above mentioned handling robot A, there has hitherto been used an apparatus of so called flog leg type with a pair of arms and its construction is as shown in FIGS. 3 to 7 of the drawings attached hereto.

In this construction, the said pair of arms, designated at 7a and 7b, of an identical length are arranged so as to be rotatable about a center of rotation. On the other hand, there are provided a pair of transfer tables 8a and 8b that have their respective bases, to each of which is connected one end of each of two legs of each of a pair of links 9a and 9b of an identical length, respectively. The said one end of each of the said two legs of each of the both links 9a and 9b is coupled via a flog leg type transfer table attitude regulating mechanism to each of the said transfer tables 8a and 8b, respectively, so that the said links 9a and 9b may be rotated in a pair of directions each of which is completely symmetrical with respect to the said transfer tables 8a and 8b.

And, one of the pair of links 9a and 9b which are coupled to the said transfer tables 8a and 8b is coupled to one of the said pair of arms 7a and 7b whereas the other of the said links 9a and 9b is coupled to the other of the said arms 7a and 7b, respectively.

FIG. 4A in the drawings attached hereto shows the said transfer table attitude regulating mechanism B of the above mentioned flog leg type, in which the respective forward end portions of the said links 9a and 9b in the pair which are coupled to the said transfer tables 8a and 8b are coupled together in a gear configuration that comprises a pair of gears 9c and 9c which mesh with each other so that the angles of attitude θ R and θ L of the said links 9a and 9b with respect to the said transfer tables 8a and 8b may always be identical to each other. This allows each of the said transfer tables 8a and 8b to be always oriented in a radial direction and operated in the radial direction.

It should be noted, however, that the above mentioned links 8a and 9b may not necessarily be coupled together in a gear arrangement, but may alternatively be coupled together with a crossed belting arrangement 9a as shown in FIG. 4B of the drawings attached hereto.

FIG. 5 of the drawings attached hereto shows a mechanism for permitting the above mentioned arms 7a and 7b to be rotated independently of each other.

The respective bases of said arms 7a and 7b are each configured in the form of a ring shaped boss and such ring shaped bosses 10a and 10b are configured so as to be coaxial about the said center of rotation and to be rotatably supported with respect to a frame 1a of the said transfer chamber 1.

On the other hand, the said ring shaped bosses 10a and 10b have a pair of disk shaped bosses 11a and 11b disposed therein, respectively, wherein a said ring shaped boss and a said disk shaped boss are opposing to each other and arranged so as to be coaxial with each other. A first pair of said mutually opposing ring shaped and disk shaped bosses and a pair of the said mutually opposing ring shaped and disk shaped bosses are coupled and decoupled with each other via each of magnetic couplings 12a and 12b, respectively, in each of the directions of rotation.

The above mentioned pair of the disk shaped bosses 11a and 11b have their respective rotary shafts 13a and 13b which are arranged so as to be coaxial with each other. The said rotary shafts 13a and 13b are coupled to the output sections of a pair of motor units 14a and 14b, respectively, which are coaxial with the said frame 1a of the transfer chamber 1 and are supported with their positions deviated in their axial direction.

The above mentioned motor units 14a and 14b have each integrally coupled thereto a motor 15 which comprises, for example, an AC servo motor and a speed reduction gear 16 which comprises, for example, a Harmonic Drive (trade name, identically referred to hereinafter). Such reduction gears 16 and 16 have their output sections which are coupled to the respective bases of the said rotary shafts 13a and 13b, respectively.

Since the space within the said transfer chamber 1 in which the arms 7a and 7b are positioned is held in an evacuated state, there is provided a sealing partition 17 each between the said ring shaped boss 10a and the said disk shaped boss 11a and between the said ring shaped boss 10b and the said disk shaped boss 11b of the present arm rotary mechanism.

FIGS. 7A and 7B show an operation of the above mentioned handling robot A. As shown in FIG. 7A, when the said two arms 7a and 7b are located at a pair of diametrically symmetrical positions, respectively, with respect to the said center of rotation, the said links 9a and 9b will be in a state in which they assume their most expanded positions with respect to each of the said transfer tables 8a and 8b so that the latter may both be displaced toward the said center of rotation.

In this state, by rotating the said two arms 7a and 7b in an identical direction, it can be seen that the said two transfer table 8a and 8b will be rotated about the said center of rotation whilst maintaining the radial positions thereof.

Also, by rotating the said two arms 7a and 7b in the directions in which they may approach towards each other (or in the mutually opposite directions), from the state shown in FIG. 7A, it can be seen that one of the said transfer tables 8a that is located at such a position that the angle made by the said two arms 7a and 7b is reduced will be pushed by the said links 9a and 9b so as to be projected in its radially outward direction so that it may be thrusted into one of the above mentioned stations 2a, 2b, 2c, 2d, 2e and 3 which are disposed adjacent to the radially outward side with respect to the said transfer chamber 1 as shown in FIG. 7B.

At this point of time, whilst the other of the said transfer tables will be displaced towards the said center of rotation, it can be seen that its amount of displacement will be small because of an angle that is made between the said arms 7a and 7b and an angle that is made between the said links 9a and 9b.

The above mentioned conventional handling robot has been expected to provide a functional effect as a two arm robot by virtue of the advantage that a pair of transfer tables are provided and can alternately or consecutively be used for each of a variety of stations. It has been found, however, that as a matter of reality there arises the following problem More specifically, since each of the said pair of the transfer tables is coupled via a pair of links commonly to a pair of arms, respectively, it has been found that when one transfer table is displaced towards a station, the other transfer table must necessarily be in a stand-by state and that this will make it impossible for an individual transfer table to be displaced optionally towards a station.

Also, in a case where a transfer table is to be rotated, a pair of transfer tables must be rotated together and this makes it impossible for an individual transfer table to be rotated as desired.

From the reasons mentioned above, in spite of the fact that there have specially been provided a pair of transfer tables, it is found that such a provision itself almost has not contributed to a desired shortening of the time cycle in a semiconductor manufacturing system that has been provided with a plurality of process chambers around a transfer chamber.

Also, in the above mentioned conventional handling robot, it is noted that a drive mechanism for rotating each of the said arms is constituted with a pair of the said motor units 14a and 14b, each of which combines the said motor 14 with a said speed reduction gear 16 that is high in the ratio of speed reduction. Since such speed reduction gears 16 and 16 of the said motor units 14a and 14b have their output sections which are connected via a pair of the said rotary shafts to a pair of the said disk shaped bosses 11a and 11b, it has been found that there must be an elongated path of power transmission provided from each of the respective output sections of the said speed reduction gears to a corresponding one of the said disk shaped bosses.

It may also be noted that although as shown in FIG. 6 of the drawing attached hereto there has been another construction of the handling robot in which a pair of disk shaped bosses 11a' and 11b' are provided interiorly with a pair of inner teeth gears 11c and 11d, respectively, with which a pair of pinion gears 13c and 13d mesh, respectively, that are securely fixed to a pair of rotary shafts 13a' and 13b' which in turn are coupled to the speed reduction gears of the said motor units 14a and 14b, respectively, such a construction again requires that there should be provided an elongated path of power transmission from each of the respective output sections of the said speed reduction gears to a corresponding one of the said disk shaped bosses.

In the drive mechanism of the conventional handling robot, the need for an elongated path of power transmission from a motor unit to a disk shaped boss as noted above has resulted in an insufficiently low torsional rigidity. Also, since a transmission torque is increased at a speed reduction gear that is remote from a disk shaped boss via a rotary shaft, a deformation thereof may give rise to an error in rotation thereof which as it is produces an error in rotary angle of an arm, thus having constituted a bottle neck in accurately controlling the rotary angle of the handling robot in the prior art.

It may also be noted that a handling robot to be used in a clean room or an evacuated state in an above mentioned semiconductor manufacturing system requires that a dust should be introduced therein at a very minimum so that no foreign matter may adhere to an object being conveyed.

In a conventional handling robot as generally mentioned above and particularly as shown in FIG. 8 of the drawings attached hereto, in which a transfer table 8 that enters into and comes out of each of the said stations 2a–2e via a said gate 6 is coupled to a pair of the said arms 7a and 7b via the said transfer table attitude regulating mechanism B of a flog leg type having a pair of rotary nodes, however, it has been found that there arises the problem that a portion of a gear transmission mechanism or a belt transmission mechanism which is included to constitute the said transfer table attitude regulating mechanism B may be a source of dusts from which a dust can develop. A further problem has been that such a portion also tends to be loosened, giving rise to a positioning inaccuracy.

Accordingly, the present invention has been made with the foregoing problems taken into account, and has for its generic object to provide a handling robot whereby the cycle time for a manufacturing operation can be shortened by permitting an action for conveying each of a plurality of transfer tables into and out of each of the stations and an action thereof to be carried out independently of each other as desired whereas the accuracy at which an arm is controlledly rotated can be enhanced by permitting any error within the path of power transmission not to influence the control of the rotary angle of the said arm.

A further important object of the present invention is to provide a handling robot whereby a dust that may be produced at a coupling portion between a transfer table and an arm can be reduced at a very minimum and any loosening that may develop at the said portion can also be reduced at a very minimum.

SUMMARY OF THE INVENTION

In order to achieve the object mentioned above, there is provided in accordance with the present invention, a handling robot which is so configured that at least four bosses may be disposed in a transfer chamber so as to be coaxial to one another and rotatable independently of one another and to be deviated in their positions towards the axis of a center of rotation; each of the said bosses may be provided with an arm, respectively; a link may be coupled to each of such arms, respectively; two of the said bosses which are adjacent to each other in an axial direction may be constituted in a pair; a transfer table may be coupled via a transfer table attitude regulating mechanism to the respective leading ends of each pair of such links which are in turn coupled to each arm of the said pair of the bosses to provide a plurality of such transfer tables which are arranged so as to be deviated in their positions towards the said axis of the center of rotation; and an independent drive source may be coupled to each of the said bosses, respectively.

And, by rotating the said pair of bosses oppositely to each other to cause a pair of arms coupled thereto in their respective directions in which they approach each other, a said transfer table will be allowed to project in its radial direction via the links coupled to the said pair of the arms. Also, by causing the said pair of the arms to be rotated in their respective directions in which they depart from each other, the said transfer table will be moved so as to be sunk or retracted.

Also, by permitting the said pair of the bosses to rotate in an identical direction, a said transfer table will be rotationally driven while maintaining its radial position.

The arms and links which individually constitute the said pairs have their respective lengths which are identical to each other, with such two arms and two links being so with respect to a single such transfer table. It should be noted, however, such arms and links as with respect to mutually different such transfer tables need not to be of an identical length in each individual pair. In this case, it can be seen that their transfer displacement should be variant for different transfer tables.

As mentioned above, it can be noted that according to a handling robot provided in accordance with the present invention, each individual transfer table may, regardless and independently of other transfer tables, perform a workpiece transfer operation between a transfer chamber and each of a variety of stations as well as a workpiece transfer operation in a rotary direction within the transfer chamber.

Accordingly, it can be appreciated that a handling robot according to the present invention, as it is installed in a semiconductor manufacturing system, may fully perform a variety of functional effects as a multiple arm (double arm) robot that can serve as a means for transferring a workpiece in a multiple chamber type manufacturing system, and will drastically shorten the cycle time of a workpiece transfer operation.

Also, in the construction mentioned above, a handling robot according to the present invention can be so constituted that a first boss section that comprises a first pair of the bosses arranged in the said axial direction and a first pair of drive units respectively coupled to the said bosses may be separately configured from a second boss section that comprises a second pair of the bosses arranged in the said axial direction and a second pair of drive units coupled respectively to the said bosses; the said first and second boss sections may be arranged so as to be opposing to each other and in such a manner that the said bosses may be made coaxial with one another; and the said plurality of the transfer tables may be arranged between the said first and second boss sections so as to be deviated in their positions towards the said axis of the center of rotation.

Thus, in the construction in which the said first boss section that comprises the said first pair of the bosses arranged in the said axial direction and the said first pair of drive units respectively coupled to the said bosses is separately configured from the second boss section that comprises the said second pair of the bosses arranged in the said axial direction and the said second pair of drive units respectively coupled to the said bosses, it will be seen that a transfer table in these boss sections can be arranged between them.

And, according to the above mentioned construction, it can be seen that the boss sections for driving the respective ones of a pair of transfer tables, respectively, can be made individual and, by positioning these boss sections so as to be spaced apart from each other, a transfer table may be disposed between them, and that thus such a transfer table may be made larger in its sinking direction.

In the above mentioned construction, it is possible that inside of the said bosses which are ring shaped, there may be different bosses which are disk shaped and are supported by a frame of the transfer chamber so as to be the said disk shaped bosses and each of the said ring shaped bosses may be coupled together via a magnetic coupling so as to be coupled and decoupled with each other in a rotary direction; each of the said disk shaped bosses may be provided inside thereof with a speed reduction gear; the said reduction gear that is provided inside of each such disk shaped boss may have an input member thereof to which is coupled a rotary shaft, respectively; such rotary shafts may be arranged so as to be coaxial with one another about the said center of rotation and so as to extend towards one side of the said axis of the center of rotation; and each of the said rotary shafts may be coupled to a motor, respectively.

According to the construction mentioned above, it can be seen that a rotation of the said drive source which causes a rotation of each of the said disk shaped bosses will be transmitted via the said rotary shaft to the said speed reduction gear whose output will be directly transmitted to a said disk shaped boss. It can also be seen that a said ring shaped boss will, by permitting the said disk shaped boss that is disposed inside of the said ring shaped boss to be rotated by the said drive source via the said speed reduction gear, be rotated via the said magnetic coupling.

And, according to the construction mentioned above, it can further been seen that by permitting an output member of the said speed reduction gear to be directly coupled to a drive member for rotationally driving a said arm, an error in the angle of rotation that occurs until it arrives at a said drive unit from a prime mover over a said rotary shaft and a said reduction gear will be transmitted as it is reduced by a reduction gear ratio of the said speed reduction gear. As a result, any influence of an error in the angle of rotation prior to its arrival at the said speed reduction gear can be drastically reduced. This may allow a power of rotation to be transmitted without transmitting such an error in the angle of rotation from the said speed reduction gear up to a said disk shaped boss; hence an enhancement in the accuracy in the control of a rotary angle of a said arm will be ensured.

In the above mentioned construction, it is possible that such motors may be disposed in parallel to one another around the said center of rotation of the said disk shaped bosses; and each of the said motors and each of the said rotary shafts may be coupled together by a power transmission means such as a timing belt.

Alternatively, it is also possible that such motors may be disposed in series with one another in the direction of the said axis of the center of rotation of the said disk shaped bosses; and each of the said motors may have an output member thereof that is directly coupled to each of the said rotary shafts, respectively.

According to such a construction as mentioned above, it will be seen that the above mentioned motors which constitute the respective prime mover sources for the said plurality of the arms can be selectively arranged in the frame, i. e. either in parallel to one another around the said center of rotation or in series with one another along the said center of rotation, in accordance with a particular frame construction employed for the transfer chamber.

Furthermore, in the above mentioned construction, it is possible that at least one of the said plurality of the transfer tables may be rendered capable of being displaced towards the said axis of the center of rotation.

It is also possible that at least one pair of the said bosses which are ring shaped and the said drive units for driving the said at least one pair of the ring shaped bosses may be rendered capable of being displaced towards the said axis of the center of rotation.

Also, it is possible that a pair of the said ring shaped bosses which are coupled to at least one of the said plurality of the transfer tables and a pair of the said disk shaped bosses which are positioned inside of the said pair of the ring shaped bosses may each be supported so as to be displaceable towards the said axis of the center of rotation; each of the said ring shaped bosses and each of the said disk shaped bosses which are opposing to each other may be coupled together by a magnetic coupling such as that of a linear rotary type which is made capable of transmitting both a force of rotation and a force of straight advancement in an axial direction; and the said inside positioned pair of the disk shaped bosses may be coupled to a linear actuator for displacing the said pair of the disk shaped bosses.

It is also possible that at a section at which a said transfer table and a said link coupled to the said transfer table are coupled together, there may be provided a displacement mechanism for displacing the said transfer table towards the said axis of the center of rotation with respect to the said link.

It is also possible that at a section at which a said link and a said arm are coupled together, there may be provided a displacement mechanism for displacing the said link towards the said axis of the center of rotation with respect to the said arm.

According to a construction as mentioned above, it can be seen that by allowing the position of a said transfer table in the axial direction of the said center of rotation to lie at the position of a said gate, the said transfer table will be selectively opposed to the said gate when the said transfer table is operatively projected into any one of the said stations, thereby permitting the height of the said gate of the transfer chamber to be in coincidence with the height of a single one of the transfer tables. The sealing ability by way of an opening and closing door for the said gate is thereby improved.

And, especially in the construction in which the above mentioned displacement mechanism is provided, it can be noted that since a displacement towards the said axial direction is effected closer to the said leading ends than a said transfer table or a said arm, its mass of displacement may be made smaller.

In the construction mentioned above, it is possible that a said boss section including a said drive unit may be supported so as to be displaceable towards the said axis of the center of rotation with respect to the said frame; and a said linear actuator may be coupled to the said boss section.

According to the construction mentioned above, it can be seen that by permitting the entire handling robot to be moved up and down with respect to the said frame, the structure of such a driving section can be vastly be simplified.

In the construction mentioned above, it is possible that at least one of the said first boss section and the said second boss section may be supported so as to be displaceable towards the said axis of the center of rotation with respect to the said frame; and a said linear actuator may be coupled to the said at least one boss section.

According to the above mentioned construction, it will be seen that since the handling robot can be divided into two separate portions, it may be sufficient for an individual displacement unit to be reduced in size.

In the construction mentioned above, it is possible that each of a said ring shaped boss and a said disk shaped boss which are opposing to each other via a said magnetic coupling may be rendered capable of being displaced towards the said axis of the center of rotation; a pair of boss sections of the said disk shaped bosses which are adjacent to each other in the said axial direction may be coupled together by a said speed reduction gear; a cam ring may be provided coaxially with each of the said disk shaped bosses of the said boss sections; a cam engagement member that is provided for each of the said disk shaped bosses may be engaged with a cam portion that is provided in the said cam coupling; and the said cam may be configured so that when the said pair of the disk shaped bosses are rotated oppositely to each other, they can be displaced as a whole towards the said axial direction.

According to the construction mentioned above, it can be seen that for the reason that an actuator needs not be provided for effecting a displacement in the said axial direction, and the number of control axes may be small, a control program can be drastically simplified.

Furthermore, in the construction mentioned above, it is possible that at a section at which a said link and a said arm are coupled together, there may be provided a cam shaft having a cam portion and a cam engagement member fitted with the said cam portion so that they can be coupled to one of the said link and the said arm; and the said cam portion may be so configured that when each pair of the said arms are rotated in their respective directions which are opposite to each other, the said pair of the links can be displaced towards an axially identical direction.

According to the above mentioned construction, it can be seen that by permitting an axial displacement of a said link with respect to a said arm to be performed so that they may be relatively rotated, an actuator for the purpose of such a displacement will become needless and yet a control program can vastly be simplified.

In order to attain another object noted previously, there is provided in accordance with the present invention, a handling robot in which there are provided at least two bosses so as to be coaxial with each other and to be rotatable independently of each other and so that they may be deviated in their positions towards the axis of a center of rotation, each of the said bosses is provided with an arm that is coupled to one of links, a transfer table is coupled to the leading ends of a pair of the said links, and an independent drive source is coupled to each of the said bosses, the handling robot being so configured that one of the said pair of the links and the said transfer table are integrally structured; and the other of the said pair of the links is coupled to the said transfer table via a rotary node.

According to the construction mentioned above, it can be seen that by permitting the said pair of bosses to be rotated oppositely to each other to allow them to be rotated in their respective directions in which they approach each other, a transfer table will be allowed to project into a desired one of the stations by the transfer chamber via those links which are coupled to said pair of the arms. Also, by permitting the said pair of arms to be rotated in their respective directions in which they depart from each other, the transfer table will be moved so as to be sunk.

Then, it can be seen that since the transfer table is structured integrally with one of the said links, its attitude when projected or sunk may not be constant and it will be displaced while drawing a trajectory in which its attitude may follow the attitude of the above mentioned one link. Accordingly, the said pair of the arms can be controlled with respect to their angles of rotation so that the said transfer table may be projected and sunk while permitting it to follow a predetermined trajectory passing through a said gate.

According to the construction mentioned above, it can be seen that by allowing a coupling between a said transfer table and a link assembly to be effected at a said rotary node, a dust may be much less produced much less frequently at a section at which the said transfer table and the said link assembly are coupled together. It should also be noted that since the number of such rotary nodes is reduced by one, a loosening that may occur at a rotary node can be minimized.

BRIEF EXPLANATION OF THE DRAWINGS

The present invention will better be understood from the following detailed description and the drawings attached hereto showing certain illustrative embodiments of the present invention. In this connection, it should be noted that such embodiments as illustrated in the accompanying drawings are intended in no way to limit the present invention, but rather to facilitate an explanation and understanding thereof.

In the accompanying drawings.

BEST MODES FOR CARRYING OUT THE INVENTION

Figure 1:
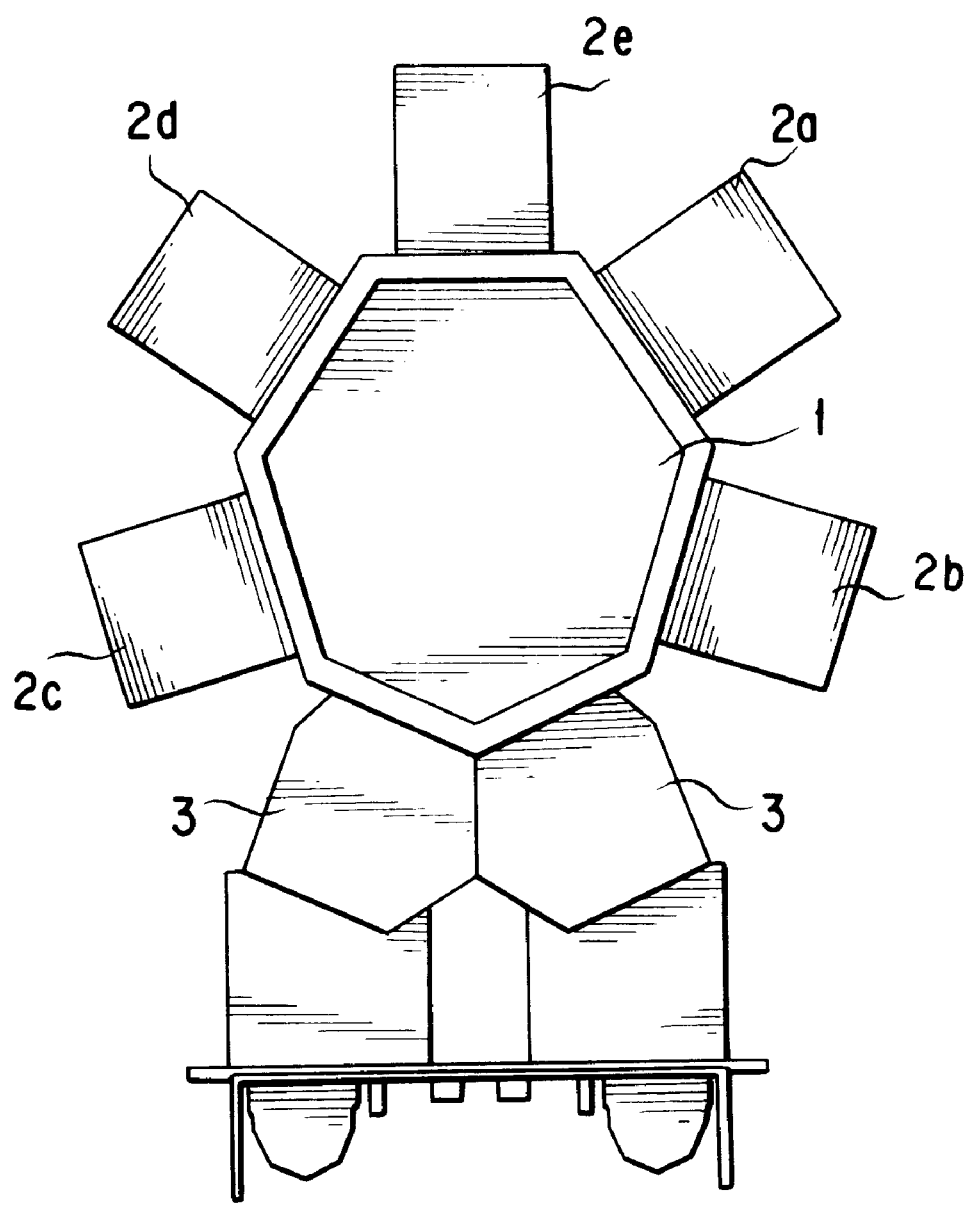
FIG. 1 is a top plan view diagrammatically showing a semiconductor manufacturing system that constitutes an example of a multiple chamber type manufacturing system.
Figure 2:
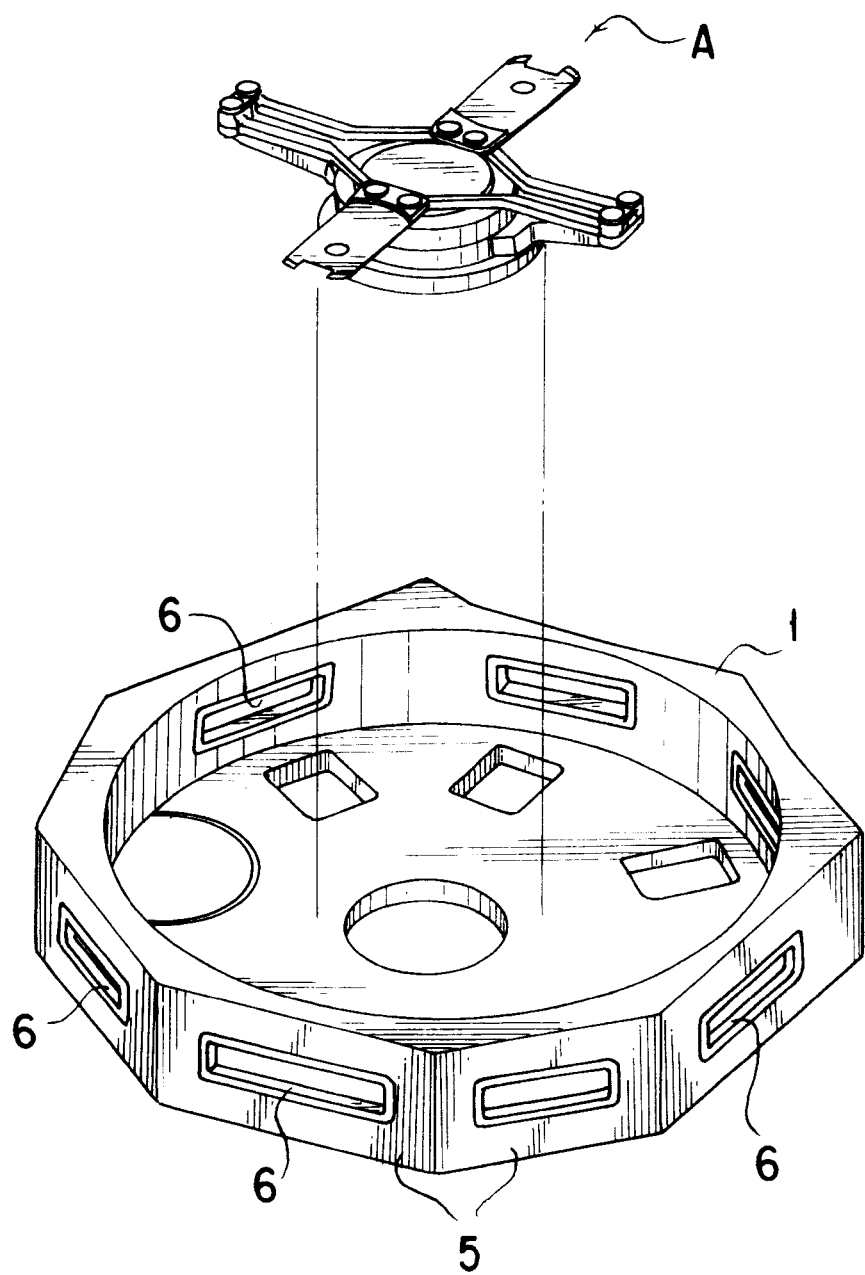
FIG. 2 is a decomposed perspective view illustrating the relationship between a transfer chamber and a conventional handling robot.
Figure 3:
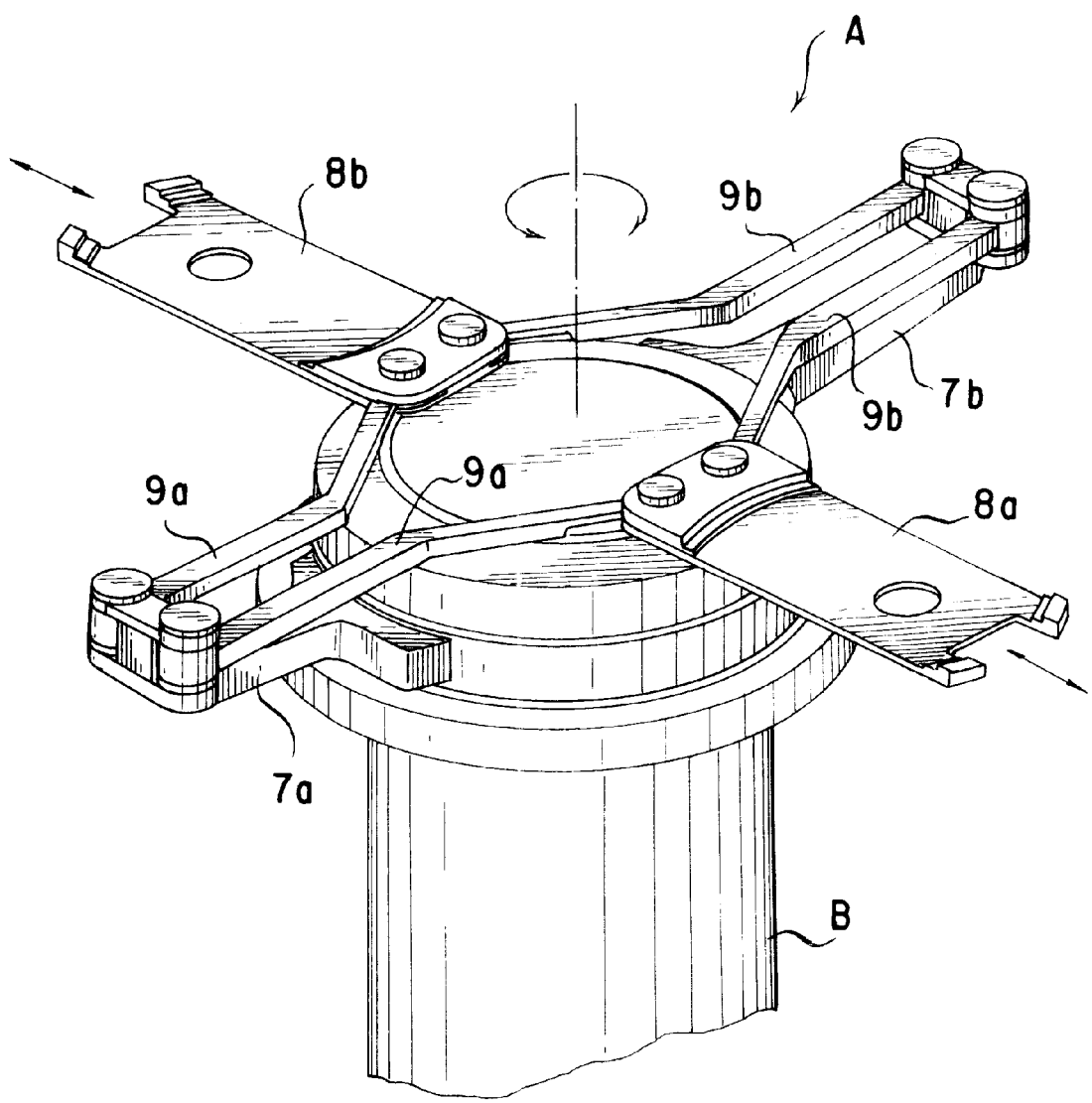
FIG. 3 is a perspective view illustrating the conventional handling robot.

Hereinafter, suitable embodiments of the present invention with respect to a handling robot will be set forth with reference to the accompanying drawings hereof.

A detailed explanation will now be given of a certain embodiment of the present invention with reference to FIGS. 9 through 29. In the explanation of the present embodiment, it should be noted that the same reference numerals and characters individually or in combination as used in the description of the prior art designate the same components or parts in FIGS. 1 to 7. It should also be noted that the present embodiment is intended to make use of a pair of transfer tables.

A transfer chamber 1 has a central region in which four ring shaped bosses 20a, 20b, 20c and 20d are supported coaxially with one other and each rotatably in a state in which they are stacked successively from a lower side thereof. And, each of the said ring shaped bosses is provided with a corresponding one of four arms 21a, 21b, 21c and 21d which have an identical length, respectively.

The second arm 21b and the third arm 21c located in a mid region are bent downwards and upwards, respectively. The leading end of the said second arm 21b is located at the same level as that of the first arm 21a in the axial direction of their center of rotation whereas the leading end of the said third arm 21 is located at the same level as that of the fourth arm 21d in the axial direction of the said center of rotation.

And, a pair of links 22a and 22b which are coupled to the respective leading ends of the said first and second arms 21a and 21b, respectively, are coupled to a single transfer table 8a via a transfer table attitude regulating mechanism of a flog leg type. Also, a pair of links 22c and 22d which are coupled to the respective leading ends of the said third and fourth arms 21c and 21d, respectively, are similarly coupled to a single transfer table 8b via such a transfer table attitude regulating mechanism.

Then, by rotating the said first, second, third and fourth ring shaped bosses 20a, 20b, 20c and 20d so as to cause the said first and second arms 21a and 21b to be rotated in their respective directions in which they approach each other, it can be seen that as with what has been described with reference with the prior art, the said transfer table 8a which is coupled with the said first and second arms 21a and 21b will be projected radially outwards of the said transfer chamber 1. Also, if the first and second arms 21a and 21b are caused to rotate in their respective direction in which they depart from each other, the above mentioned transfer table 8a will be moved so as to be sunk or retracted radially inwards of the said transfer chamber 1.

On the other hand, if the said pair of the arms 21a and 21b are rotated in an identical direction, the said transfer table 8a will be rotated in their direction of rotation while maintaining its radial position.

Such an operation should be performed in an entirely same manner as the above with the said third and forth arms 21c and 21d.

And, in such an operation in which one pair of the said first and second arms 21a and 21b and the other pair of the third and fourth arms 21c and 21d are each rotated in a state in which they are spaced apart from each other in their vertical direction (i. e. in the axial direction of the said center of rotation) and hence do not interfere with each other, the two transfer tables 8a and 8b which are coupled with the said one and other pairs of the arms, respectively, will be operated independently of each other as desired with respect to the said projection, retraction and rotation, individually.

In an inside in which the above mentioned ring shaped bosses 20a, 20b, 20c and 20d are opposing to one another, four disk shaped bosses 23a, 23b, 23c and 23d are supported by a frame 1a of the said transfer chamber 1 so as to be each rotatable in a state in which they are laid one above another in their axial direction.

And, each of the said ring shaped bosses 20a, 20b, 20c and 20d and each of the said disk shaped bosses 23a, 23b, 23c and 23d which are opposing to each other are coupled together by each of four magnetic couplings 24a, 24b, 24c and 24d, respectively, and also so decoupled, in a rotary direction thereof.

In the above mentioned construction, it should be noted that in order to maintain the interior of the said transfer chamber 1 in an evacuated state, a sealing partition wall 17 is provided between the said ring shaped bosses and the said disk shaped bosses. It should also be noted that in place of the above mentioned magnetic couplings 24a to 24d, there may be used a magnetic fluid seal (i. e. a ferro-seal that contains a permanent magnet).

Inside of the above mentioned disk shaped bosses 23a to 23d, four speed reduction gears 25a, 25b, 25c and 25d are incorporated, respectively. Each of the said speed reduction gears, in view of the requirements that it should be incorporated within a said disk shaped boss, a space that is extremely limited, and that it should produce an extremely high ratio of speed reduction, has made use of a Harmonic Drive, supra, of a flat type that consists of a wave generator a, a flex spline b and a pair of circular splines c and d, which has hitherto been used widely.

Four rotary shafts 26a, 26b, 26c and 26d are coupled to the respective input members of the said speed reduction gears 25a to 25d, respectively. The said rotary shafts are disposed coaxially with one another, of which the first, second and third rotary shafts 26a, 26b and 26c are hollow and fitted in and coaxially with one another. Thus, the second rotary shaft 26b is fitted in the first rotary shaft 26a, the third rotary shaft 26c is fitted in the second rotary shaft 26b and the fourth rotary shaft 26d is fitted in the third rotary shaft 26c.

Figure 12:
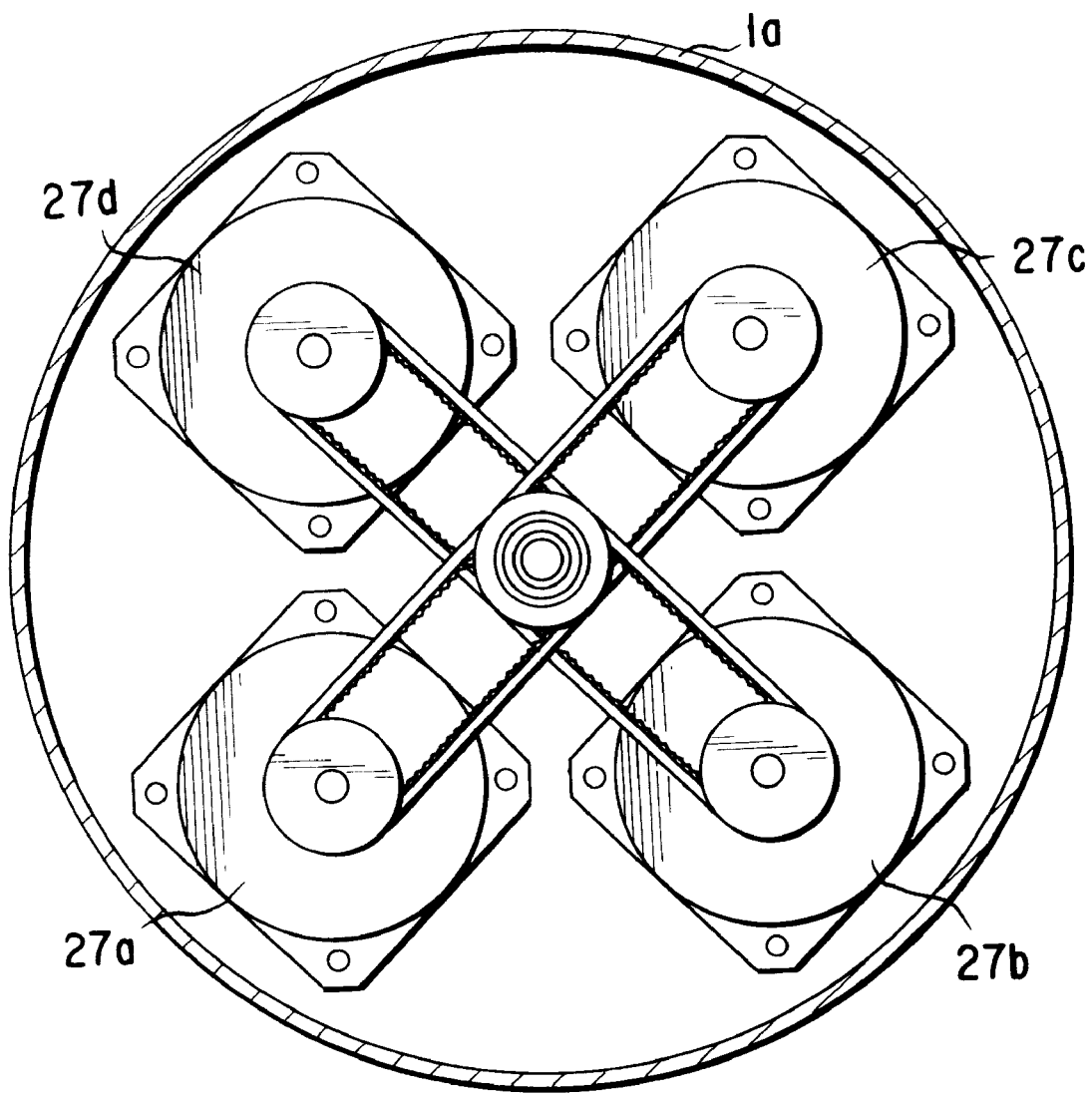
FIG. 12 is an explanatory view showing a state in which a plurality of motors are arranged in parallel to one another.

And, the respective lower ends of the said rotary shafts 26a to 26d are successively deviated in their positions in their vertical direction and are each exposed into the said frame. A timing pulley is fastened to each such exposed portion. Also, the respective output shafts of four motors 27a, 27b, 27c and 27d are coupled to the said rotary shafts 27a, 27b, 27c and 27d via four timing belts, respectively. The said motors 27a to 27d are disposed around the said rotary shafts 26a to 26d so as to be deviated in their positions within the frame 1a as shown in FIG. 12.

Of the above mentioned four motors, the first and second motors 27a and 27b constitutes one pair whereas the third and forth motors 27c and 27d constitute the other pair, the two pairs of motors being rotationally controlled, respectively.

More specifically, by permitting the said first and second motors 27a and 27b to rotate oppositely to each other over an identical angle of rotation, the respective rotations of the said pair of the motors 27a and 27b will be transmitted via a pair of the said timing belts to a pair of the said speed reduction gears 25a and 25b, a pair of the said disk shaped bosses 23a and 23b, a pair of the said magnetic couplings 24a and 24b and a pair of the said ring shaped bosses 20a and 20b, respectively, to rotate the said first and second arms 21a and 21b oppositely to each other in their respective directions in which they approach each other or in which they depart from each other. If they are rotated in their directions in which they approach each other, the said transfer table 8a will be moved so as to be projected. Also, if they are rotated in the directions in which they depart from each other, the said transfer table 8a will be operatively moved so as to be sunk or retracted.

When the said pair of the motors 27a and 27b are rotated in an identical direction, the said pair of the arms 21a and 21b will be rotated as a whole in one direction or the other.

With the other pair of the motors 27c and 27d, an entirely same operation will be performed as with the above mentioned one pair of the motors 27a and 27b. Then, if the other pair of the third and fourth arms 21c and 21d are rotated symmetrically or in an identical direction by said other pair of the third and fourth motors 27c and 27d, the said second transfer table 8b will be operatively moved so as to be projected or to be sunk or retracted.

Then, since the said one pair of the first and second arms 21a and 21b and the other pair of the third and fourth arms 21c and 21d are spaced apart from each other in their vertical directions, the said one pair of the first arms 21a and 21b and the other pair of the third and fourth arms 21c and 21d will be rotationally driven without interfering with each other.

The respective rotation of each of the above mentioned motors 27a to 27d will, as noted above, be introduced via a said timing belt and a said rotary shaft corresponding thereto into the input member of a said speed reduction gear corresponding thereto, where it will be reduced in speed with a large reduction ratio and then furnished to a disk shaped boss corresponding thereto. Accordingly, if there is a loosening such as a back-lash due to a said timing belt and if there is a deformation of a said rotary shaft, an error in the angle of rotation over will over the path be transmitted after a reduction thereof by the said reduction ratio to the output side. Hence, its influence on the latter will be vastly reduced.

Figure 13:
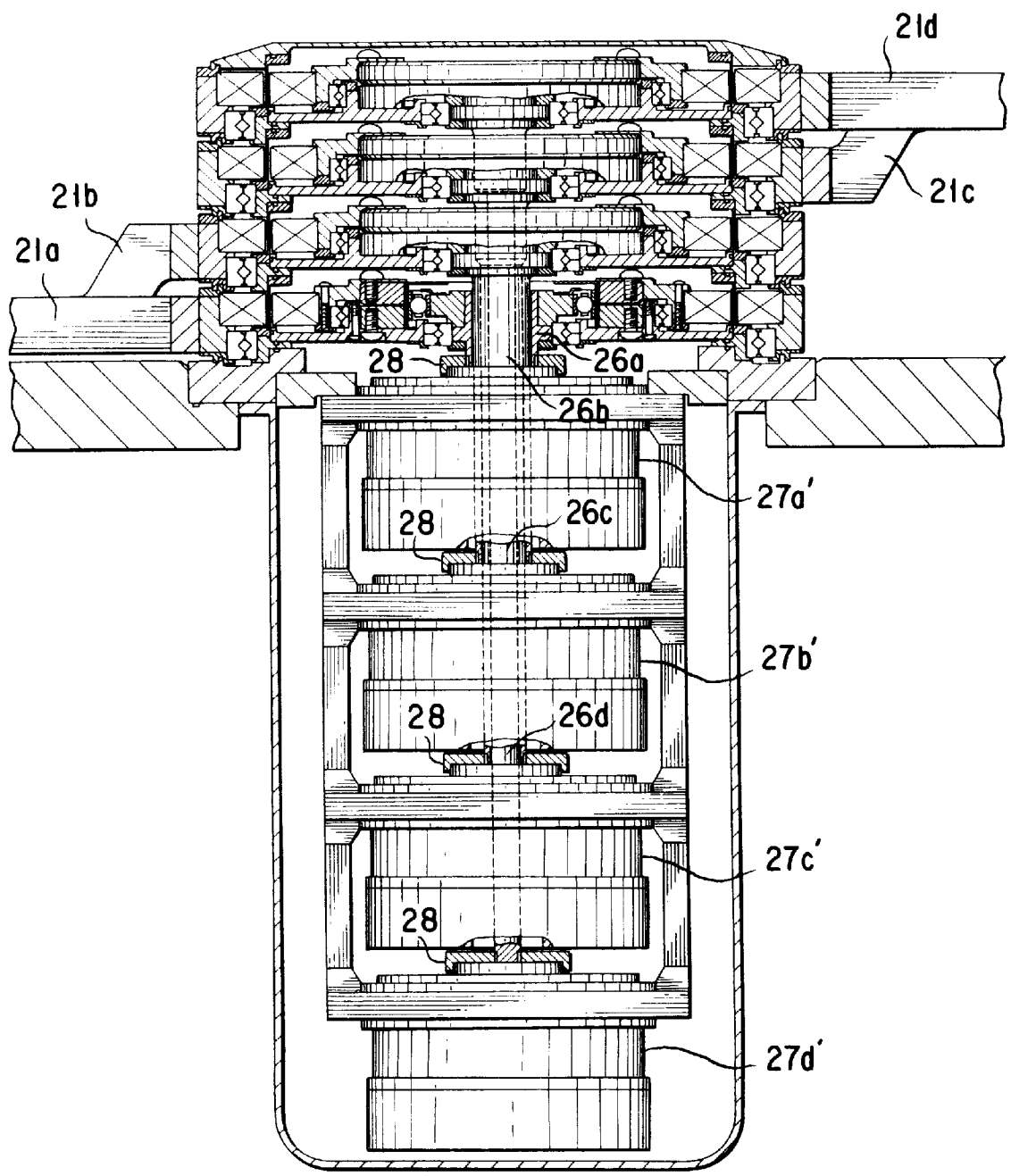
FIG. 13 is an explanatory view showing a state in which a plurality of motors are arranged in series with one another.

Whilst FIGS. 9 to 12 shows an example in which the said motors 27a to 27d each of which is coupled to a said rotary shaft corresponding thereto are arranged around the said center of rotation and a said timing belt is used as a means for coupling them together, it should be noted that the said motors may alternatively be arranged in series with one another in the direction of the said center of rotation as shown in FIG. 13.

In this case, the first to third motors 27a' to 27c' except the fourth motor 27d' that lies at the lowest side are so configured as to be hollow or to provide three hollow spaces therein into which the said second to fourth rotary shafts 26b and 26d are successively inserted.

In this example, the respective output members 28 of the said motors 27a' to 27d' are directly coupled to the said rotary shafts 26a to 26d, respectively.

In a handling robot according to the present invention, it has been shown that each single transfer table will be operatively moved so as to be projected and to be sunk or retracted radially with respect the center of rotation by one or the other symmetrical rotations of a pair of motors, and will also be rotationally operated by rotating such a pair of motors in an identical direction.

Figure 10:
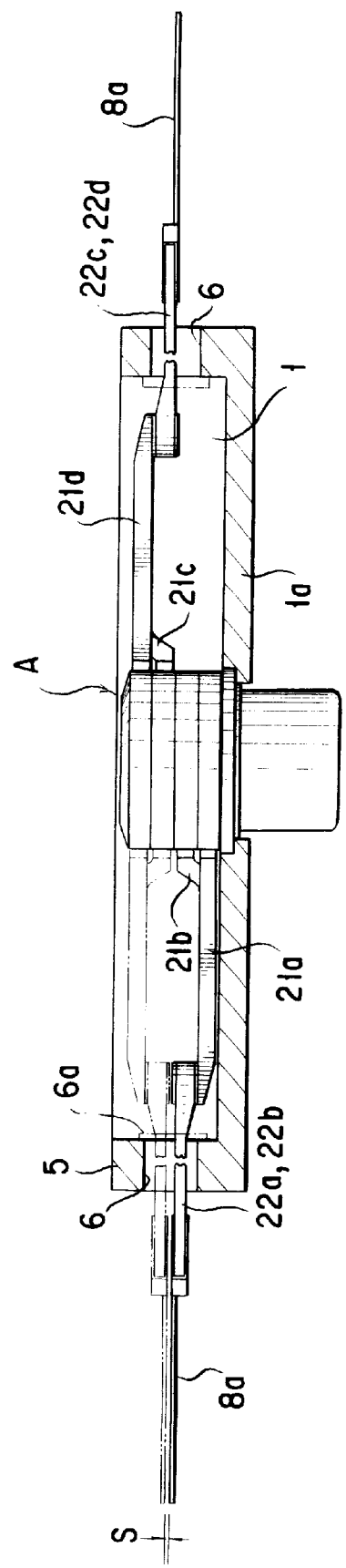
FIG. 10 is a front view, partly cut away, showing the handling robot according to the present invention.
Figure 11:
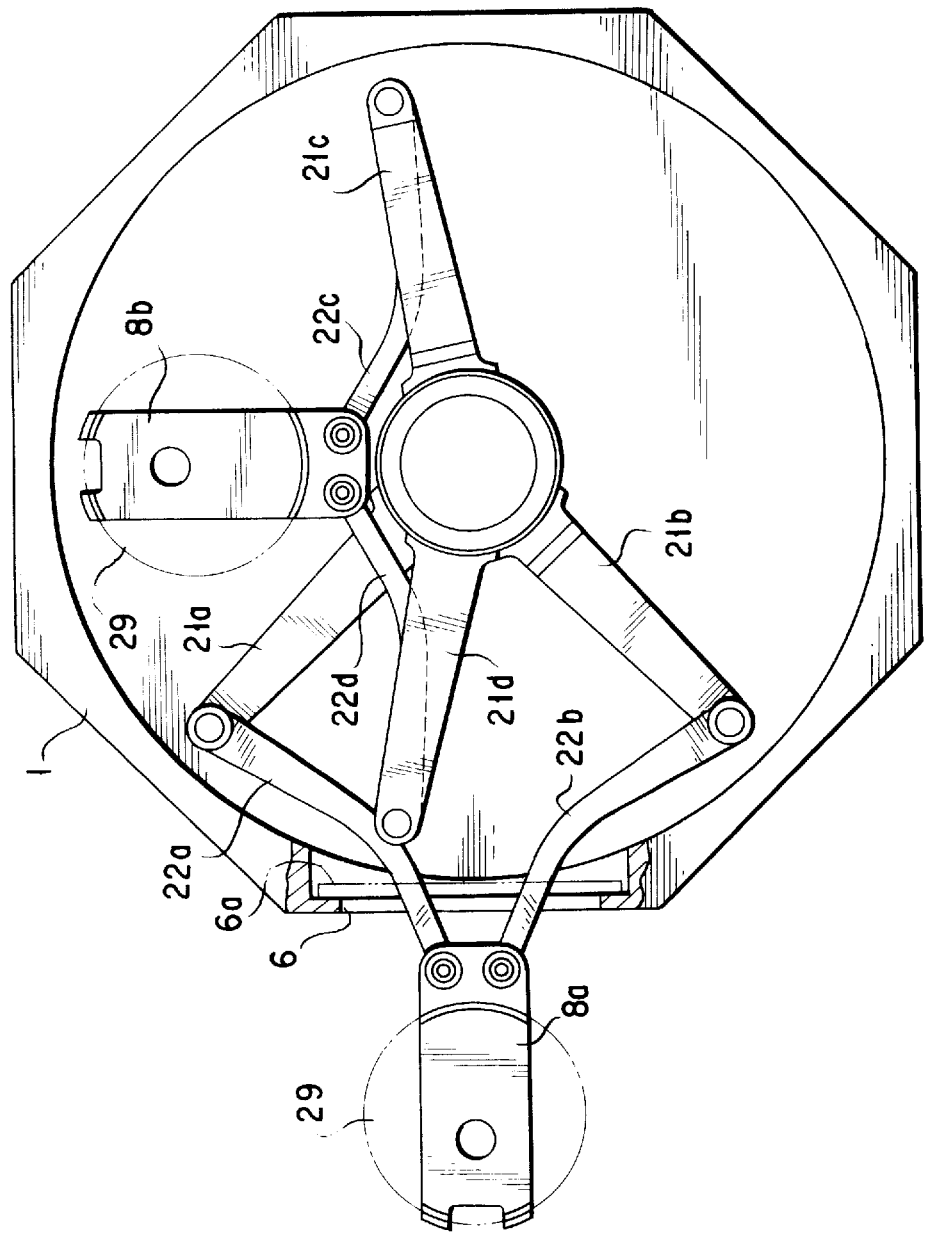
FIG. 11 is a functional explanatory view showing the handling robot according to the present invention.

And, by way of such a projecting operation as mentioned above, the said transfer table 8a and the respective leading ends of the said links 22a and 22b will be projected into any one of the said stations from a said gate 6 provided in the said partition wall 5 of the transfer chamber 1 so that a wafer 29 which comprises a semiconductor blank that has been mounted on the said transfer table 8a may be carried into the said station, as shown in FIGS. 10 and 11.

Also, by way of such a sinking or retracting operation as mentioned above, the said wafer 29 in the said station will be carried into the said transfer chamber 1, and a rotary operation in such a sinking or retracting state will cause the transfer table 8a, 8b to be opposing to a said gate in a preselected station.

Then, since the above mentioned two transfer tables 8a and 8b are spaced apart from each other by a distance S in the vertical direction so that they may not interfere with each other when they are rotated as mentioned above, the said gate through which each of them is to be passed is designed to have such a height of its opening as to enable both the said transfer table 8a and 8b and both the said link 22a, 22b to be sufficiently passed therethrough.

An above mentioned gate 6 is provided with an opening and closing door 6a as mentioned above. The said opening and closing door 6a is designed to perform an opening and closing operation in conjunction with the operation of the above mentioned transfer tables 8a and 8b, and to remain closed unless it needs to be opened or closed. The said transfer chamber 1 is designed to remain in an evacuated state, so is each of the said station by a suction unit before the said door 6a is opened.

In the case of a semiconductor manufacturing system, each electrical property of a semiconductor must be kept secured with precision by using a thin film thereof in the order of nanometers. Thus, in its manufacturing process, it becomes critical to enhance the quality of such a film in conjunction with the enhancement of the integration and function levels of an element. And, if such a film has the molecules of an unnecessary gas adsorbed thereto, it is altogether possible that the film may be deteriorated in its quality and its essential properties and reliability may be seriously lowered.

For this reason, the conveyance of a wafer from the transfer chamber 1 to each of the stations has been carried out in an extremely evacuated state or under an ultra-high vacuum (or in a high purity gaseous atmosphere that is substantially equivalent to an ultra-high vacuum) for the purpose of eliminating any influence whatsoever of a residual gas on the wafer in each of the stations.

It is to this end that, as mentioned above, a said gate 6 of the said transfer chamber 1 is provided with a said opening and closing door 6a and is designed to be opened and closed by the said opening and closing door 6a in conjunction with the projecting and retracting operations for each of the said transfer tables 8a and 8b.

The said opening and closing door 6a for an above mentioned gate 6 is made substantially larger than the area of opening of the said gate 6 and is adapted to be thrusted against the said gate 6 to provide such a seal that a gas may not be leaked.

A said gate 6 should better be as small as possible to ensure its enhanced ability to seal.

In the embodiment of the present invention set forth above, however, it should be noted that as has been mentioned, in order to enable a pair of the said transfer tables 8a and 8b whose positions are deviated in the vertical direction to be passed therethrough, it happens to ensue that a said gate 6 has an unexpected enlarged area and involves what is desirable as to its sealability when it is sealed with the said opening and closing door 6a. Also, it should be mentioned that another problem in this connection is that if the area that receives a differential pressure between the said transfer chamber 1 and any one of the said stations is enlarged, an actuator that is required to thrust the said opening and closing door 6a needs to be of an increased output.

In order to resolve these problems, there is provided an arrangement in which the said pair of the transfer tables may no longer be passed simultaneously though a said gate 6 whereby at least one of the said transfer tables is rendered displaceable vertically from a position at which they do not interfere with each other when they are rotated to a position of the other of the said transfer tables. Thus, the solution of the problems will be the determination of the vertical width of a said gate 6 to be a width that is just sufficient for only one of the said transfer tables to be passed therethrough.

Figure 14:
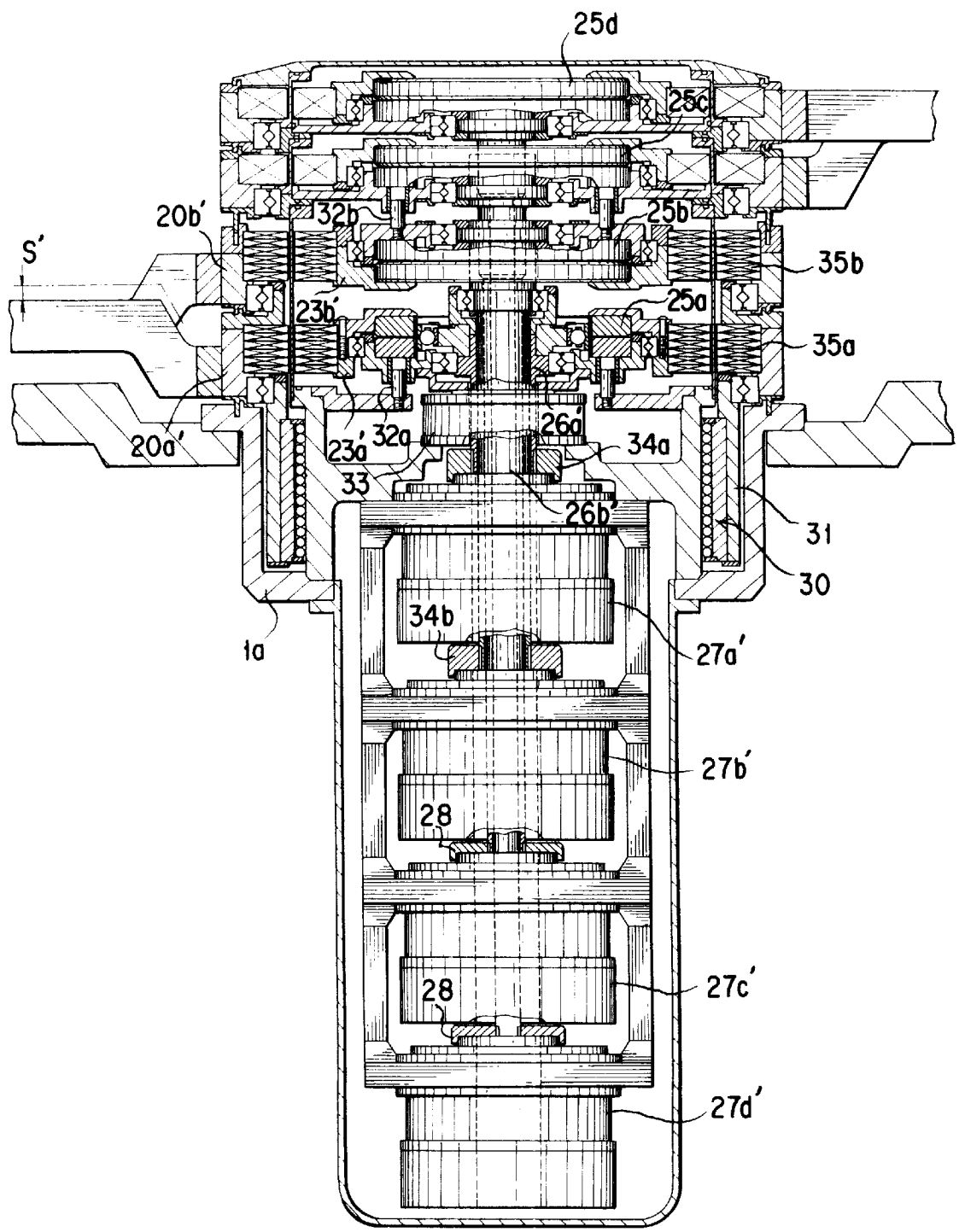
FIG. 14 is a cross sectional view showing a construction in which one transfer table is rendered capable of being displaced towards the central axis of rotation.

FIG. 14 shows an example of the construction in which the lower transfer table 8a is rendered vertically displaceable so that a pair of the first and second ring shaped bosses 20a' and 20b' and a pair of the first and second disk shaped bosses 23a' and 23b' may be moved as a whole vertically by a distance S' that represents the height of the above mentioned vertical deviation in position.

More specifically, the ring shaped boss 20a' that is located at the lowermost position is rotatably supported by a vertical displacement member 31 which in turn is supported so as to be vertically displaceable over the above mentioned distance S' via a vertical displacement guide means 30 constituted of a linear ball bush, with respect to the said frame 1a of the transfer chamber 1.

And, above the said first ring shaped boss 20a', there is supported the said second ring shaped boss 20b' so as to be rotatable integrally therewith in the vertical direction.

On the other hand, the said first and second disk shaped bosses 23a' and 23b' are constituted as integral with each other in their vertical direction via a pair of speed reduction gears 25a and 25b disposed inside thereof. A reduction gear fixing member of the said first and lower speed reduction gear 25a and a reduction gear fixing member of the said second and upper speed reduction gear 25b are supported and engaged with each other via a pair of pins 32a and 32b, respectively, in their rotary direction and so as to be displaceable in their vertical direction over the above mentioned distance S', each at the side of the said frame 1a of the transfer chamber 1.

And, an electrically actuated cylinder 33 that makes use of a linear stepping motor is interposed between the above mentioned reduction gear fixing member of the said first and lower speed reduction gear 25a and the said frame 1a so that the said member may be displaced vertically by the said distance S' by means of the said electrically actuated cylinder 33.

The respective speed reduction gears 25a and 25b for the above mentioned first and second disk shaped bosses 23a' and 23b' have their respective rotary shafts 26a' and 26b' whose leading ends are engaged with each other in their rotary direction so as to be slidable via a spline with respect to the respective output shafts 34a and 34b of a pair of motors 27a' and 27b'.

Between the said first and second ring shaped bosses 20a' and 20b' and the said first and second disk shaped bosses 23a' and 23b', there are provided, respectively, a pair of magnetic couplings 35a and 35b of a linear rotary type, in place of customary magnetic couplings, which enable both a force of rotation and an axial force of straight advancement to be transmitted.

In such a construction as mentioned above, by displacing the said reduction gear fixing member of the first and lower speed reduction gear 25a upwards by means of the said electrically actuated cylinder 33, it can be seen that the said pair of the ring shaped bosses 20a' and 20b' will be displaced together upwards by the said distance S' so that a said first transfer table 8a may be displaced upwards via a pair of the said arm fastened thereto to reach a level that is identical to that of a said second transfer table 8b.

Accordingly, by permitting the said first transfer table 8a located at the lower side to be lifted up to this position when projected into any one of the said stations, it can be seen that the size of a said gate 6 in its vertical direction may be a size which enables only one of the said single transfer tables 8a and 8b to be passed therethrough.

At this point it should be noted that whilst only one of the said transfer tables is permitted to be displaced vertically in the example shown in FIG. 14, it can also be arranged so that both of the said two transfer tables 8a and 8b may be displaced as a whole vertically.

Several examples of the present embodiment of the invention will be explained below with reference to FIGS. 15 to 19.

* The example in which the said bosses in a set are vertically moved as a whole (FIG. 15):

The said first, second, third and fourth disk shaped bosses 23a to 23d are arranged so as to be rotatable independently of one another and are coupled together in an axial direction. Similarly, the said ring shaped bosses 20a to 20d which are opposing to the said disk shaped bosses 23a to 23d, respectively, via the said magnetic couplings of the linear rotary type, are arranged so as to be rotatable independently of one another and are coupled together in an axial direction.

The said ring shaped boss 20a and the said disk shaped boss 23a are supported so as to be slidable axially via a linear guide 30a on a lower cylindrical member 41 that is fastened to a side of the said frame 1a.

Also, the said fourth ring shaped boss 20d and the said disk shaped boss 23d are supported so as to be slidable axially via a linear guide 30b on an upper cylindrical member 42 that is coupled to a said partition wall 17 which is fastened to the above mentioned lower cylindrical member 41.

Also, since the said speed reduction gears 25a to 25d which are disposed inside of the above mentioned disk shaped bosses 23a to 23d are supported on the said disk shaped bosses 23a to 23d, they are made capable of being displaced axially in an integration with the said disk shaped bosses 23a and 23d. Also, the said fixing member of the first speed reduction gear 25a is coupled via a bracket 43 to a said electrically actuated cylinder 33 that makes use of a linear stepping motor whereas the respective fixing members of the other speed reduction gears 25b to 25d are each coupled to the fixing member of the said first speed reduction gear 25 in their rotary direction. Also, the fixing member of the said fourth and uppermost speed reduction gear 25d is coupled to a pin so as to be slidable axially with respect to a cover 44 that is integral with the above mentioned upper cylindrical member 42.

On the other hand, the respective input end sides of the said rotary shafts 26a to 26d which are coupled the respective input members of the said speed reduction gears disposed inside of the above mentioned disk shaped bosses, respectively, are engaged with the respective output sections of the said motors 27a' and 27d', respectively, via four splines so as to be axially slidable.

In the construction of this example, it can be seen that the said bosses as a whole are vertically displaced by the extension and retraction operations of the said electrically actuated cylinders 33.

And, by operating, at the both positions, the said motors 27a' and 27b' each in a predetermined manner, it can be seen that each of the said transfer tables 8a and 8b will be opposed to a said gate 6 corresponding thereto to perform a predetermined operation.

Figure 9:
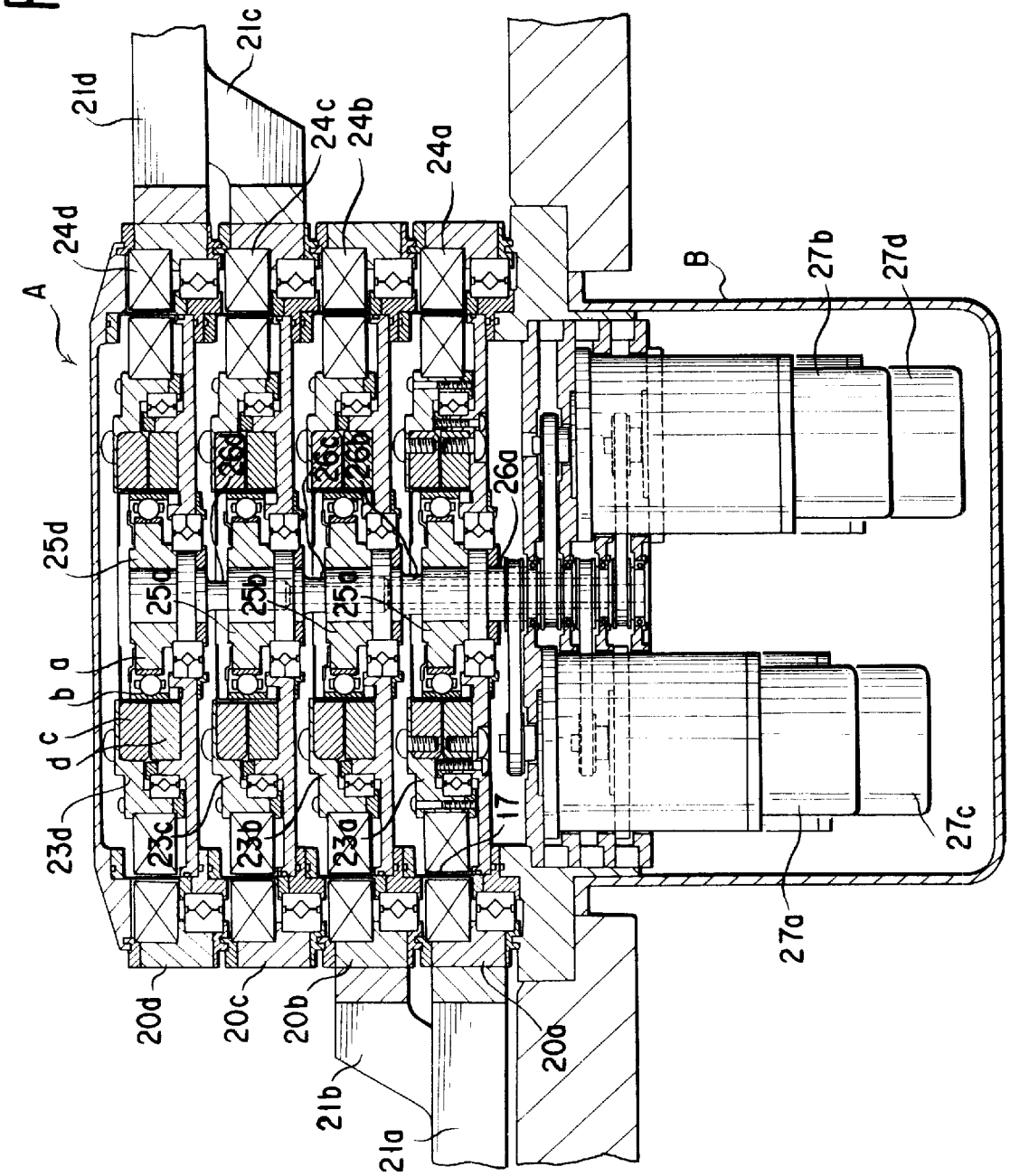
FIG. 9 is a cross sectional view illustrating an arm rotary mechanism of a certain embodiment of the handling robot according to the present invention.

* An entire boss section containing a drive unit is vertically displaced (FIG. 16):

In this example, a case 46 itself in which the said motors 27a to 27d of a handling robot A shown in FIG. 9 are received, is supported via a linear guide 45 within the said frame 1a so as to be vertically displaceable by the above mentioned stroke S and is adapted to be driven by a said electrically actuated cylinder 33. It should be noted in this case that the said case 46 which is fitted in the said frame 1a so as to be slidable, is engaged with a pin 1b so that it may not be rotated with respect to the said frame 1a.

Also, in order to prevent a dust from intruding from the said linear guide portion 45 into the said transfer chamber 1, it is seen that a bellows 46a is interposed between the said case 46 and the said frame 1a.

\* The boss section is vertically displaced by a cam mechanism (FIGS. 17 to 19):

A set of the said first to fourth ring shaped bosses 20a to 20d and a set of the said first to fourth disk shaped bosses 23a to 23d are each rendered axially slidable.

And, a first cam ring 47a is fastened to the output portion of the said first speed reduction gear 25a and a cam follower 50a that is provided for the said first disk shaped boss 23a via a supporting rod 49a is engaged with a cam slot 48a that is provided in the said cam ring 47a. And, a guide pin 51a that protrudes from the said first cam ring 47a is fitted in the second disk shaped boss 23b so as to be axially slidable.

A second cam ring 47b is fastened to the output portion of the said second speed reduction gear 25b and a cam follower 50a that is provided for the said second disk shaped boss 23b via a supporting rod 49b is engaged with a cam slot 48b that is provided in the said cam ring 47b. And, a guide pin 51b that protrudes from the said second cam ring 47b is fitted in the first disk shaped boss 23a so as to be axially slidable.

A third cam ring 47c is fastened to the output portion of the said third speed reduction gear 25c and a cam follower 50c that is provided for the said third disk shaped boss 23c via a supporting rod 49c is engaged with a cam slot 48c that is provided in the said cam ring 47c. And, a guide pin 51c that protrudes from the said second cam ring 47c is fitted in the fourth disk shaped boss 23d so as to be axially slidable.

A fourth cam ring 47d is fastened to the output portion of the said fourth speed reduction gear 25d and a cam follower 50d that is provided for the said fourth disk shaped boss 23d via a supporting rod 49d is engaged with a cam slot 48d that is provided in the said cam ring 47d. And, a guide pin 51d that protrudes from the said fourth cam ring 47d is fitted in the third disk shaped boss 23c so as to be axially slidable.

Figure 17:
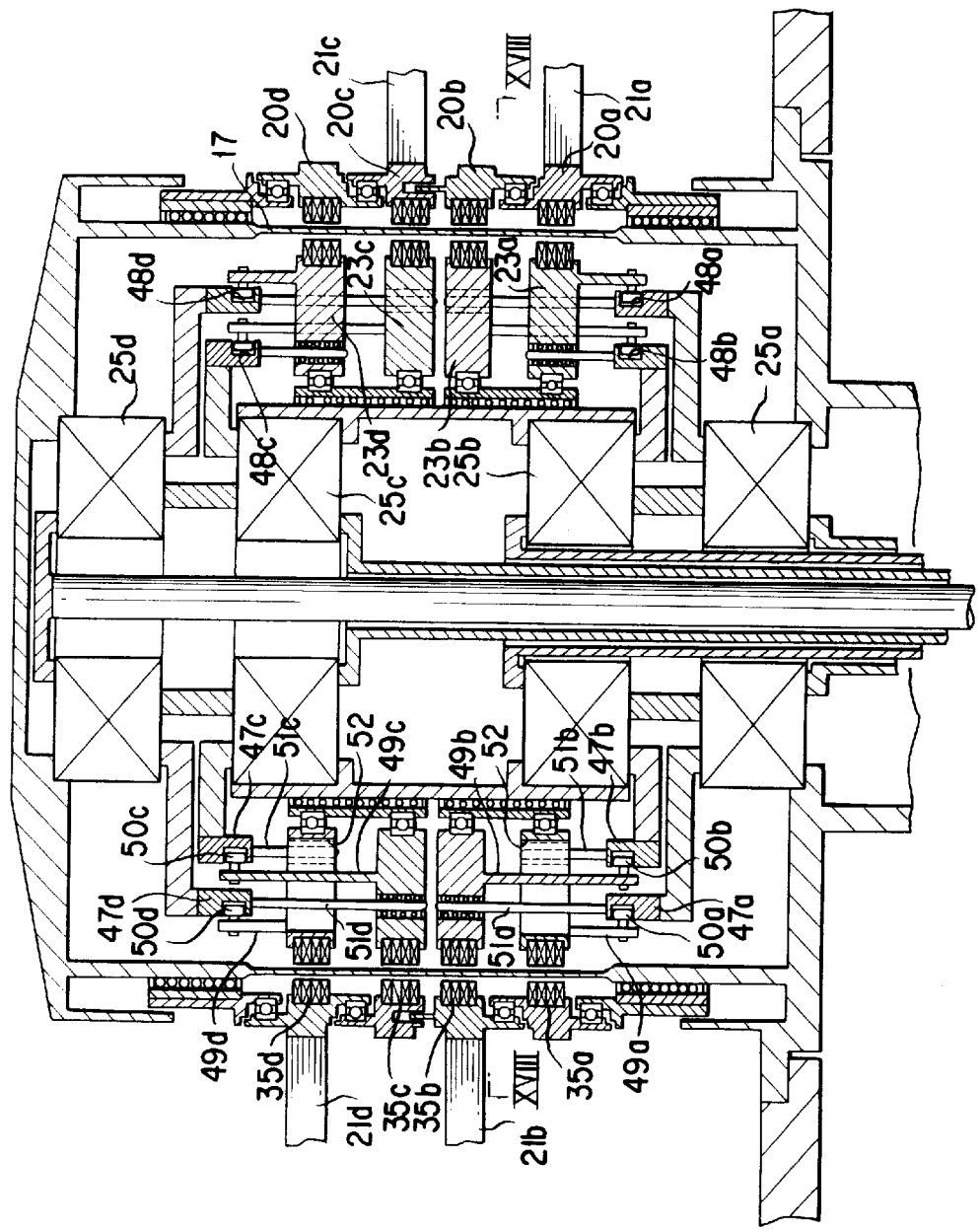
FIG. 17 is a cross sectional view showing the construction in which the whole of the bosses is rendered capable of being displaced towards the central axis of rotation.
Figure 18:
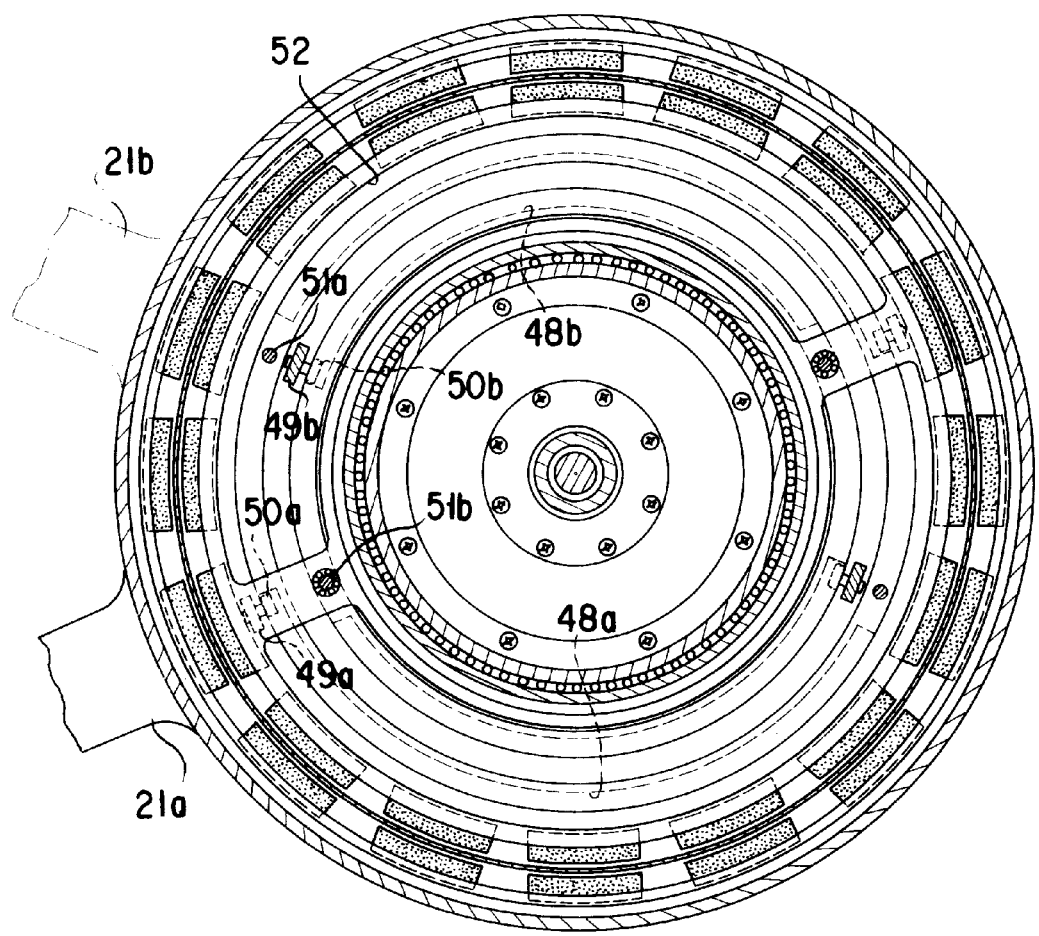
FIG. 18 is a cross sectional view taken along the line XVIII—XVIII in FIG. 17.

As shown in FIGS. 17 and 18, the said first and fourth disk shaped bosses 23a and 23d are each provided with a space 52 through which the said guide pin 51a (51d) and the supporting rod 49b (49c) of the said cam follower pass and which allows them not to interfere with the said disk shaped bosses when these bosses are each rotated.

An explanation will now be given with respect to the functions in this construction and the shape of each of the said cam slots 48a and 48b with reference to FIG. 19.

If the said first cam ring 47a is rotated rightwards by $\omega$ 1 via the said first speed reduction gear 25a and the second cam ring 47b is likewise rotated leftwards by $\omega$ 1 via the said second speed reduction gear 25b, then the said second disk shaped boss 23b and the first disk shaped boss 23a which are coupled thereto via the said guide pins 51a and 51b, respectively, will be rotated rightwards and leftwards, respectively. This will cause the said first and second ring bosses 20a and 20b positioned outside thereof to be rotated via the said magnetic couplings of linear rotary type 35a and 35b, respectively, in their respective directions in which the said arms 21a and 21b approach each other.

This will in turn cause the said cam follower 50a that is provided for the said first disk shaped boss 23a to be displaced within the said cam slot 48a and then to be lifted up by the distance S and the said cam follower 50b that is provided for the said second disk shaped boss 23b to be likewise displaced within the said cam slot 48b by a predetermined distance, thereby lifting up both the said disk shaped bosses 23a and 23b by the distance S. This will further cause the said first and second ring shaped bosses 20a and 20b to follow the above mentioned displacements so as to be lifted up via the said magnetic couplings of linear rotary type 35a and 35b, thus permitting the said first transfer table 8a to be opposing to a said gate 6 within the said transfer chamber 1.

Further, if the said pair of the disk shaped bosses 23a and 23b are rotated by $\omega$ 2 and $\omega$ 2, the said first and second ring shaped bosses 20a and 20b will be rotated via said magnetic couplings of linear rotary type, respectively, so that the said transfer table 8a will, whilst maintaining its height, be moved so as to be projected into a process chamber.

If the said pair of the disk shaped bosses are rotated from this state by $\omega$ 2 oppositely to each other, then the said transfer table 8a will be moved so as to be sunk or retracted into the said transfer chamber 1. Then, if they are likewise rotated further by $\omega$ 1, the said lower transfer table 8a will be displaced downwards by the above mentioned distance S so as to deviate in position from the said gate 6.

The said third and fourth cam slots 48c and 48d located upwards and the said first and second cam slots 48a and 48b located downwards are oriented in the opposite directions. If the said ring shaped bosses 20c and 20d are rotated by $\omega$ 1 via the said speed reduction gears 25c and 25d in the opposite directions in which the said arms 21c and 21d approach each other, the said disk shaped bosses 23c and 23d will be moved downwards by the above mentioned distance. This will cause the said upper transfer table 8b to be displaced downwards within the said transfer chamber 1 so as to be opposing to a said gate 6. If they are likewise rotated further by $\omega$ 2, the said upper transfer table 8b will be projected from the said gate 6 into a process chamber. And, if they are rotated oppositely to each other, the said transfer table 8b will be sunk or retracted in the said transfer chamber 1 whilst being displaced upwards so as to deviate in position from the said gate 6.

Figure 20A:
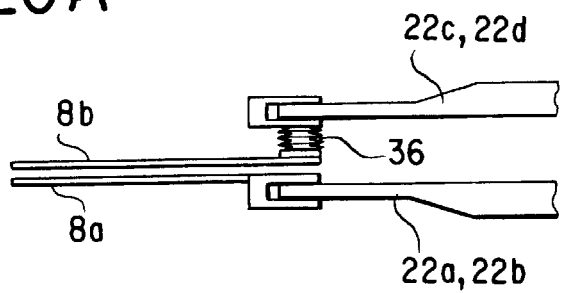
FIGS. 20A and 20B are each a functional explanatory view showing a construction in which a transfer table is rendered capable of being displaced towards the central axis of rotation.
Figure 20B:
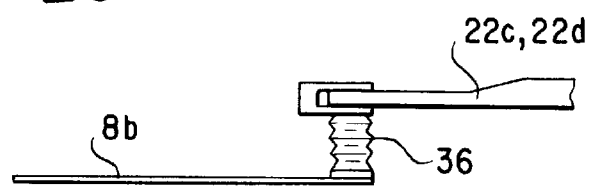

\* A said transfer table is vertically displaced:

Also, in order to coincide the height of one of the said two transfer tables with the height of the other, there may be provided an arrangement, as shown in FIG. 20A, in which an extender and retractor unit 36 that comprises a screw or a cylinder mechanism which is adapted to extend and retract vertically is provided at a portion at which one of the said transfer tables 8b is coupled to the said links 22a and 22b of a said transfer table attitude regulating mechanism and the said transfer tables 8a and 8b are made identical in level by permitting the said unit 36 to be elongated as shown in FIG. 20B.

In the construction in which at least one of the said transfer tables 8a, 8b is displaced towards the axial direction of the previously mentioned center of rotation, it should be noted that in a case where there are three or more transfer tables, any arrangement that permits only one of them to be displaced will not allow a said gate 6 to be minimized in its height (i. e. to have a height with which only one of the said transfer tables is allowed to pass therethrough).

Figure 21:
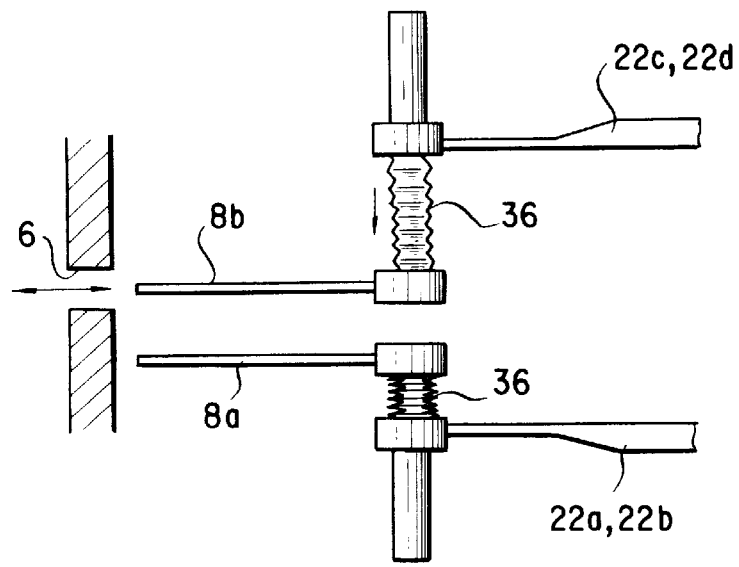
FIG. 21 is a functional explanatory view showing a construction in which a transfer table is rendered capable of being displaced towards the central axis of rotation.

For this reason, there should be provided an arrangement, as shown in FIG. 21, in which each of the said transfer tables 8a. 8b. . . . is coupled to each of the arms via each of the extender and rectractor units 36, 36, . . . , respectively, and is displaced thereby so that each such transfer table may individually be opposing to a said gate 6 which is minimized its height.

Figure 22:
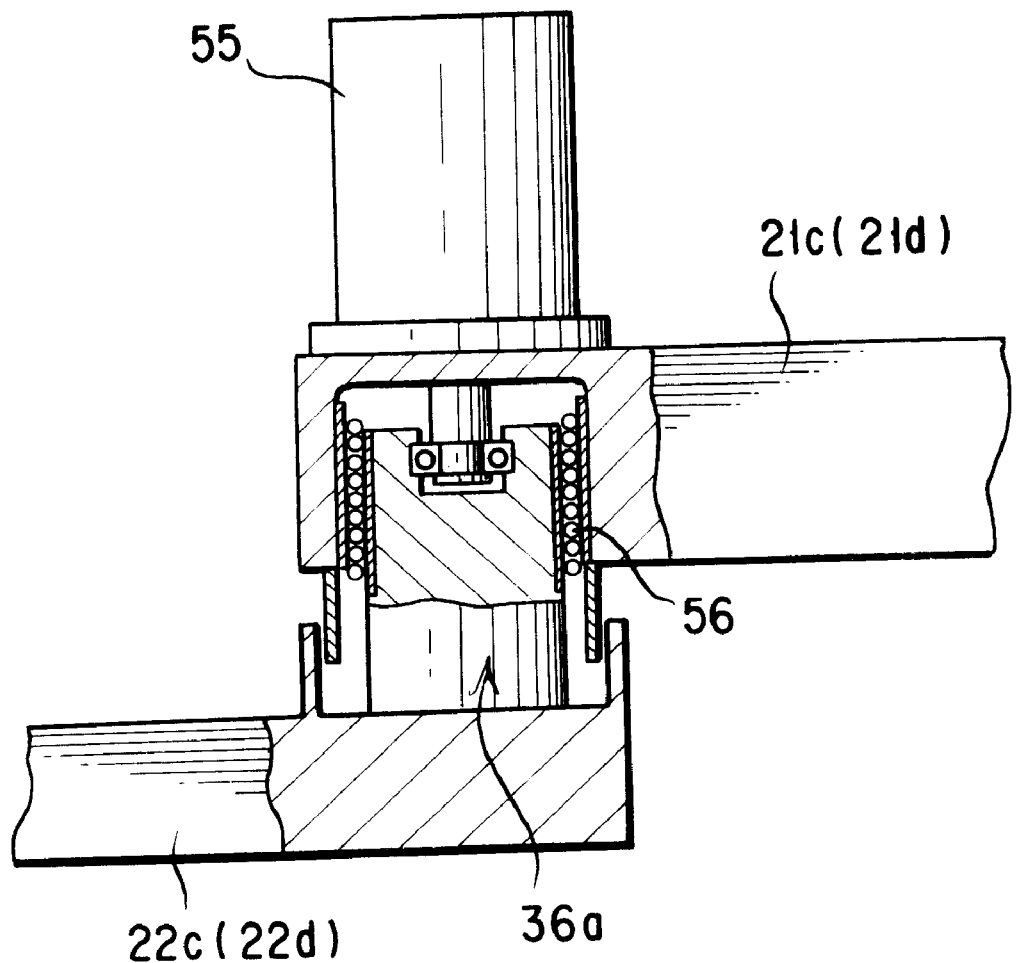
FIG. 22 is a cross sectional view showing a mechanism for displacing a link with respect to an arm in the axial direction.

\* A said link is vertically displaced:

In order to allow the above mentioned transfer tables 8a and 8b to be vertically displaced, there may be provided an arrangement, for example, as shown in FIG. 22, in which the said links 22c and 22d are coupled via a said extender and retractor unit 36a to the respective leading ends of the said third and fourth arms 21c and 21d.

In a construction as shown here, reference numeral 55 designates a linear actuator, and reference numeral 56 denotes a linear rotary ball bearing. It can be seen that the said links 22c and 22d will be vertically displaced by the extension and retraction operation of the said linear actuator and will allow the said transfer table 8b to be vertically displaced thereby.

Figure 23:
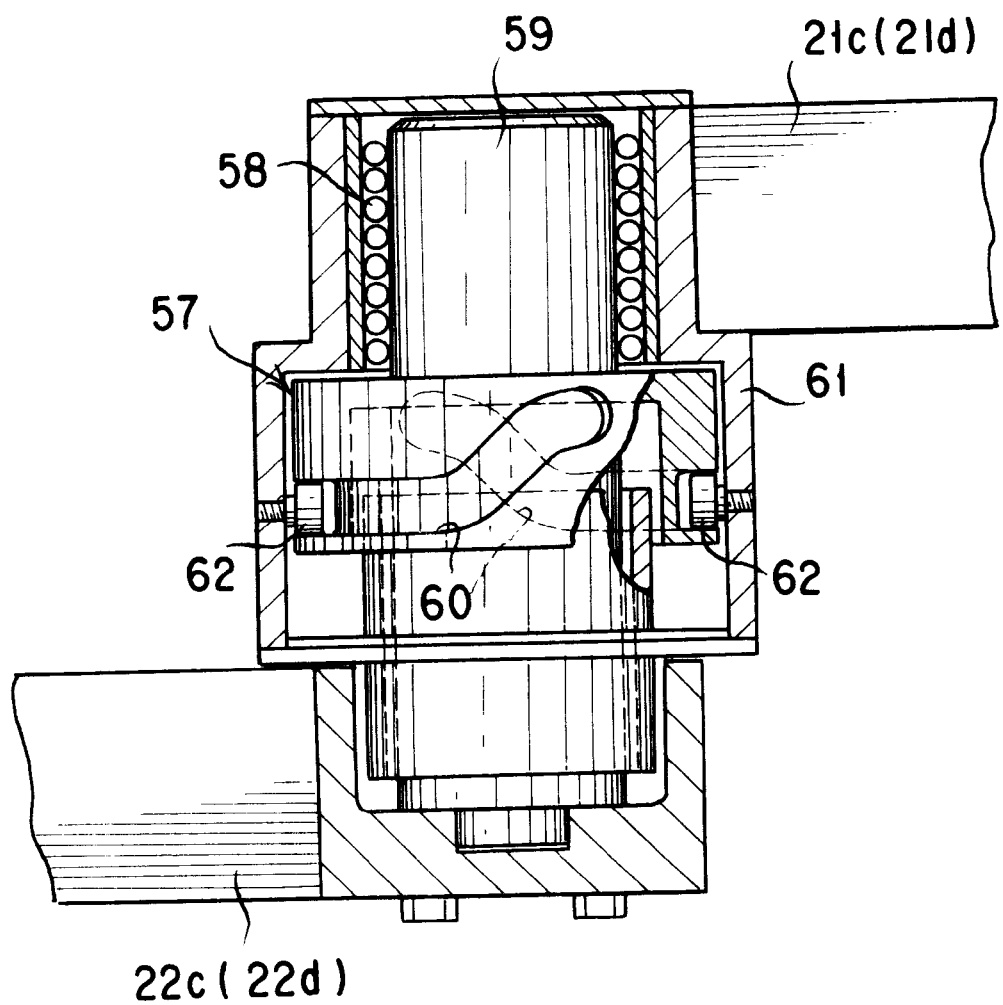
FIG. 23 is a cross sectional view showing another mechanism for displacing a link with respect to an arm in the axial direction.

FIG. 23 shows another example of the extension and retraction unit for vertically displacing the said links 22c and 22d with respect to the above mentioned arms 21c and 21d, in which a cam mechanism 57 is used in place of the said linear actuator 55.

More specifically, a cam shaft 59 is supported via a linear rotary ball bearing 58 by the leading end of the said arm 21c (21d), and the said link 22c (22c) is fastened to the leading end of the said cam shaft 59 integrally therewith. A pair of cam slots 60 and 60 are symmetrically provided on both surfaces of the said cam shaft 59, and are fitted with a pair of cam followers 62 and 62 which are provided in a cylindrical member 61 that is fastened to the said arm 21c (21d).

A said cam slot 60 and a said cam follower 62 are related to each other in such a manner that in a terminal state of the operation in which the said transfer table 8b is sunk or retracted, it may, when within the transfer chamber 1, be vertically deviated in position from a said gate 6 and that when it is operatively projected slightly from its terminal position of such a sinking or retracting operation, the said transfer table 8b may be vertically displaced so that the said transfer table 8a, 8b can assume the height of the said gate 6 so as to be projected into a process chamber immediately before the leading end of the said transfer table 8b reaches the peripheral wall of the said transfer chamber 1. It should be noted that this operation is identical for the other transfer table 8a as well.

Figure 24:
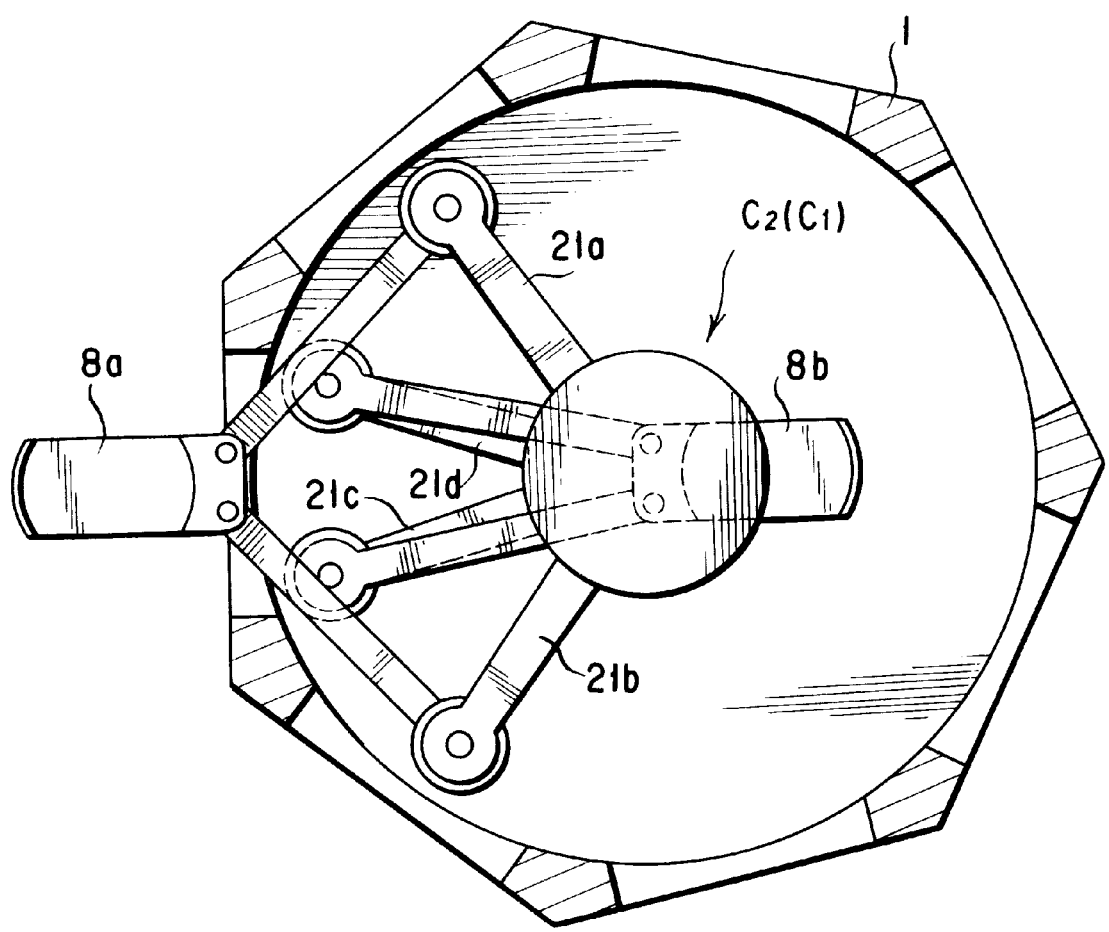
FIG. 24 is a top plan view showing an example of the construction in which the boss section is divided in the axial direction.
Figure 25:
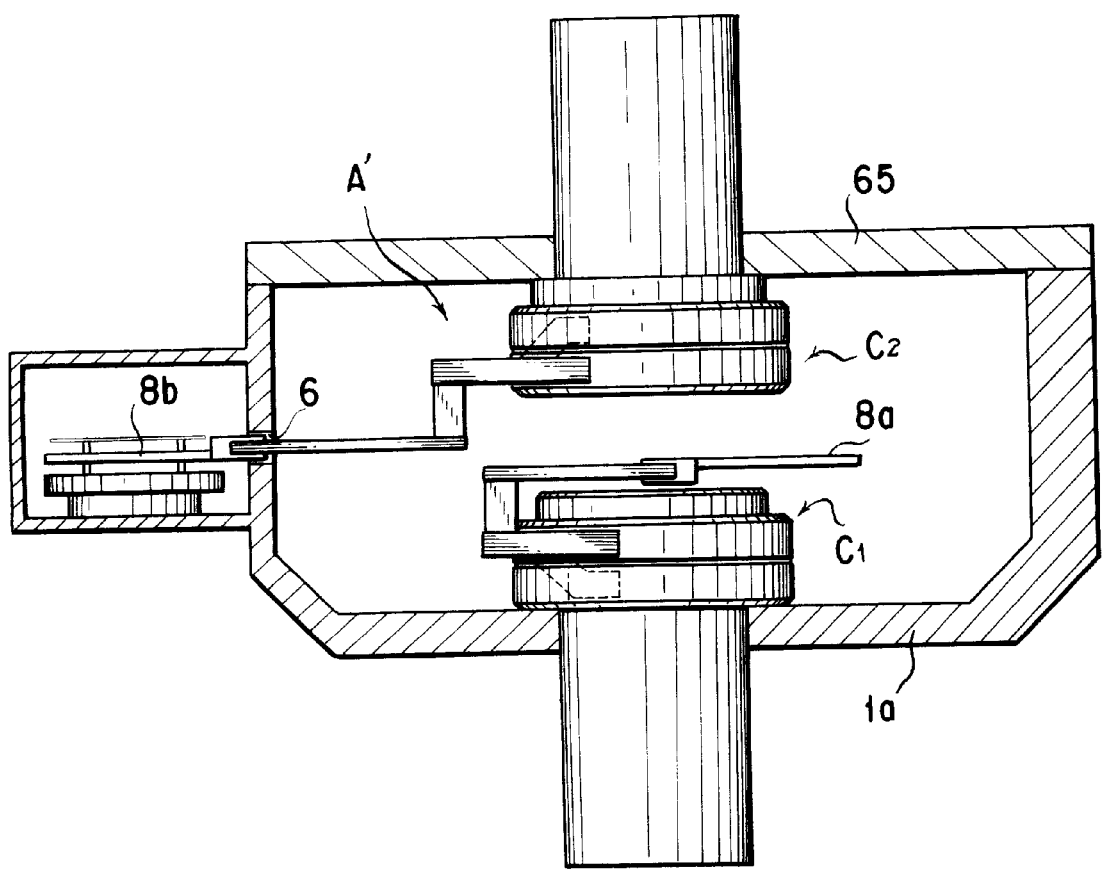
FIG. 25 is a front view showing an example of the construction in which the boss section is divided in the axial direction.

An explanation has hereinbefore been given with respect to each of a variety of examples of the first embodiment of the present invention having a construction in which a series of the first, second, third and forth ring shaped bosses 20a to 20d each with a drive unit are laid one above another to constitute a boss section that is supported on the frame 1a at a bottom side of the transfer chamber 1. It should be noted here that alternatively, such a boss section may, as shown in FIGS. 24 and 25, be divided vertically into a first boss section that is comprised of the said first and second ring shaped bosses 20a and 20b and a second boss section that is comprised of the said third and fourth ring shaped bosses 20c and 20d and that the said first boss section which is lower may be arranged to be opposing to the frame 1a at the bottom side of the said transfer chamber 1 whereas the said second section which is upper may be arranged to be opposing to a chamber cover 65 for closing the upper side of the said transfer chamber 1, the said two boss sections being disposed coaxially with each other.

According to this alternative example, four drive units are divided into two pairs thereof which are located up and down, thus permitting each of the drive units to be readily assembled and maintained.

Several constructions of a handling robot A' in each of which the drive units are divided into two pairs thereof that are located up and down are shown in FIGS. 25 to 29.

Figure 15:
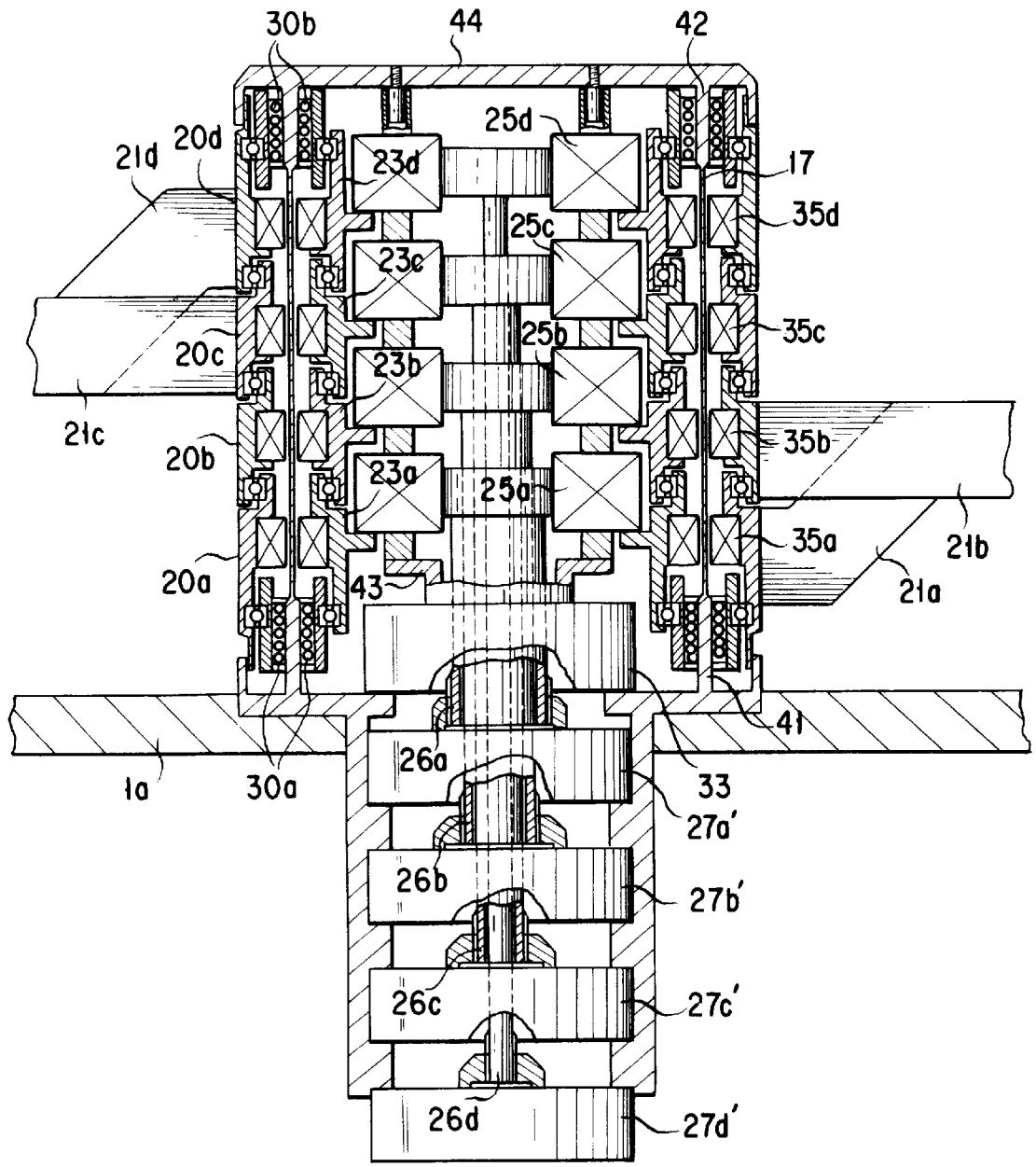
FIG. 15 is a cross sectional view showing the construction in which the whole of the bosses is rendered capable of being displaced towards the central axis of rotation.

* At least one of the two boss sections is vertically displaced (FIGS. 25 and 26):

This example corresponds to an arrangement, as shown in FIG. 15, in which a boss section as a whole of the bosses is vertically displaced, and represents an example in which the arrangement of FIG. 15 is vertically divided into a lower boss section C1 for driving the said first and second ring shaped bosses 20a and 20b and an upper boss section C2 for driving the said third and fourth ring shaped bosses 20c and 20d.

Figure 26:
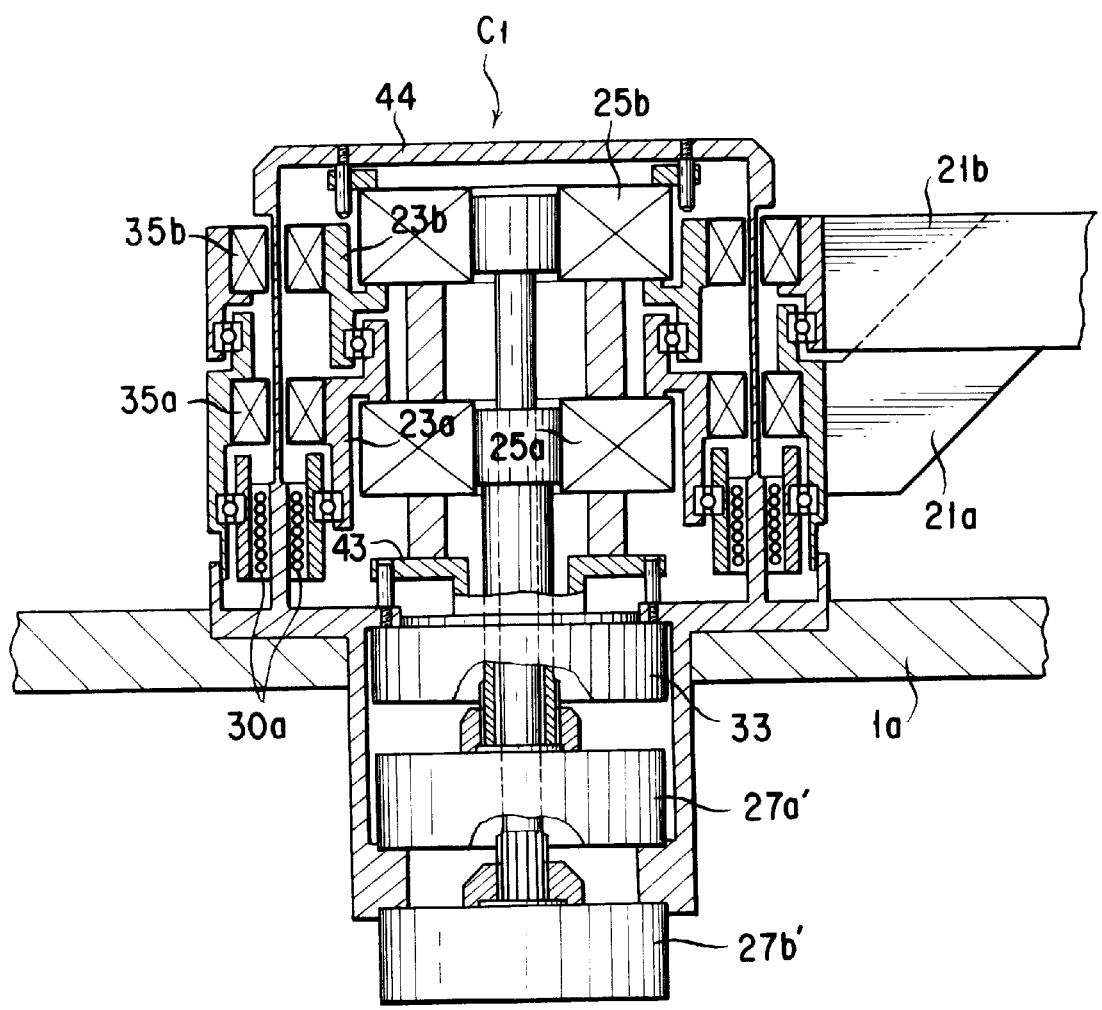
FIG. 26 is cross sectional view showing one of individual bosses into which the boss section in divided in the axial direction.
Figure 27:
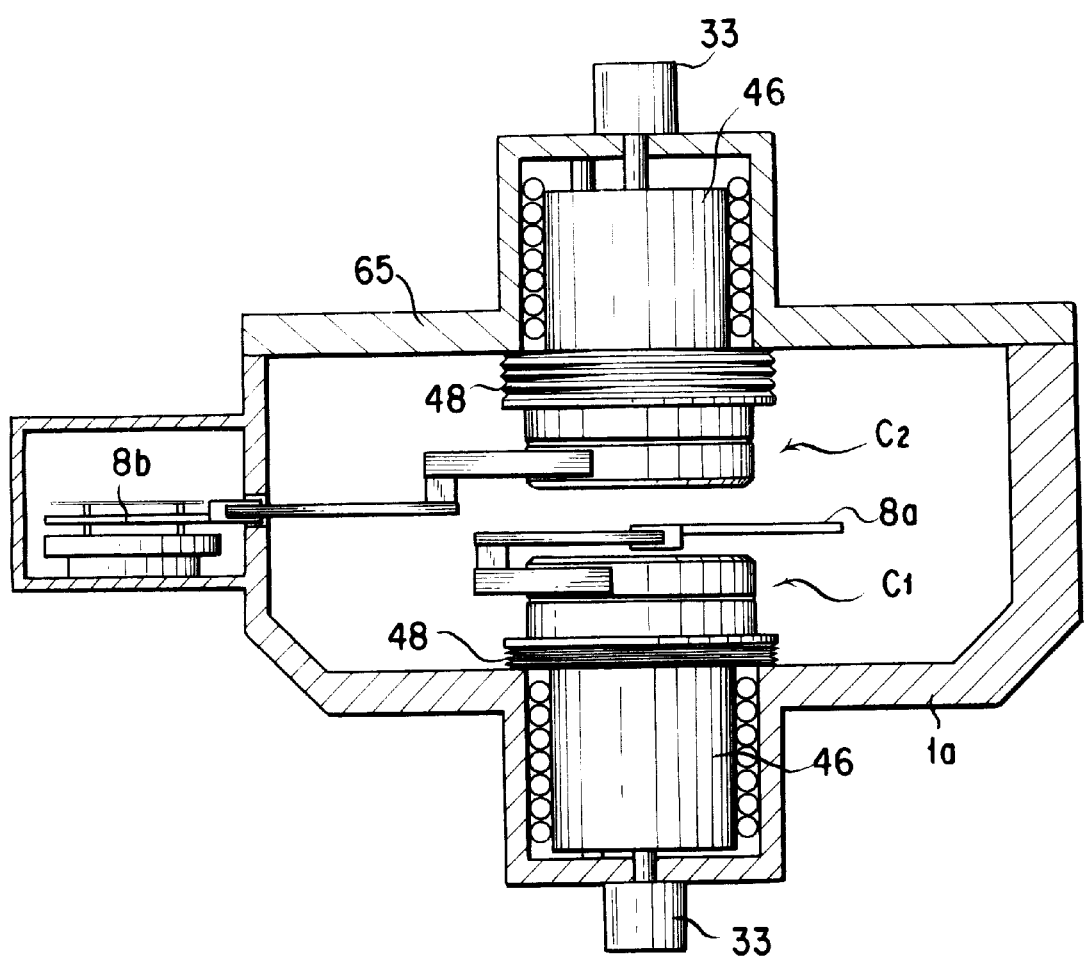
FIG. 27 is a cross sectional view showing an example in which the boss section is divided in the axial direction into individual bosses which are rendered capable of being displaced in the axial direction.
Figure 28:
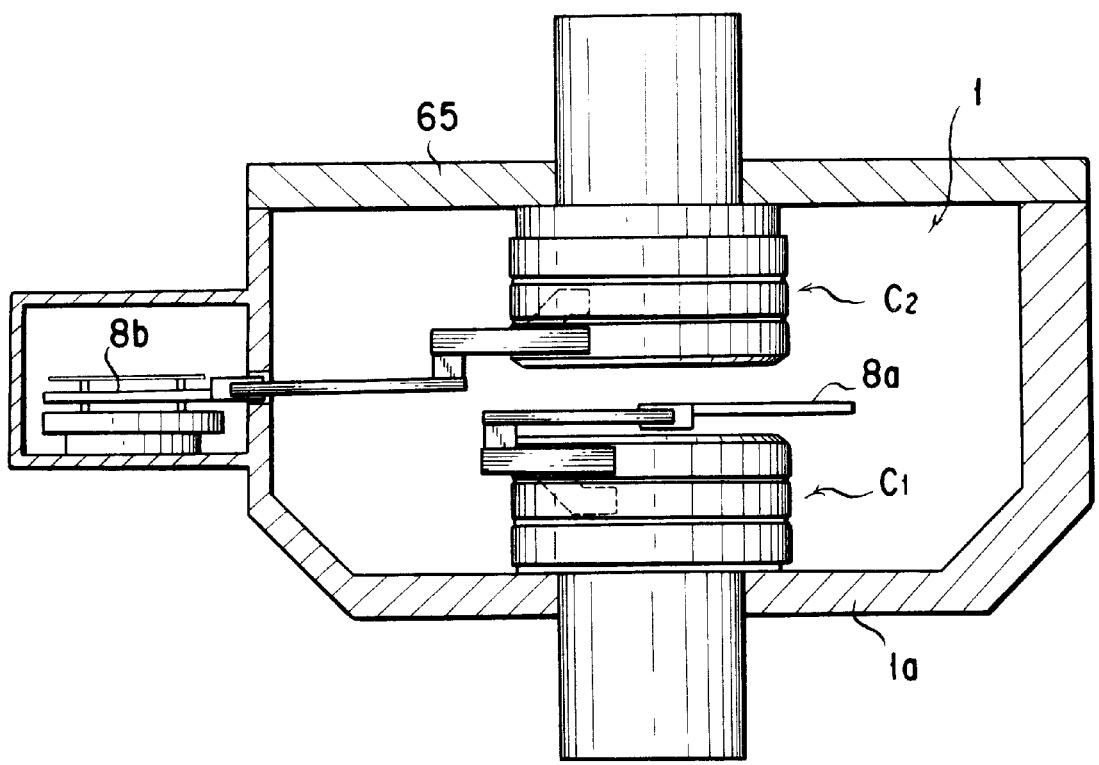
FIG. 28 is a front view showing an example in which the boss section is divided in the axial direction into individual bosses which are rendered capable of being displaced in the axial direction by using a cam mechanism.
Figure 29:
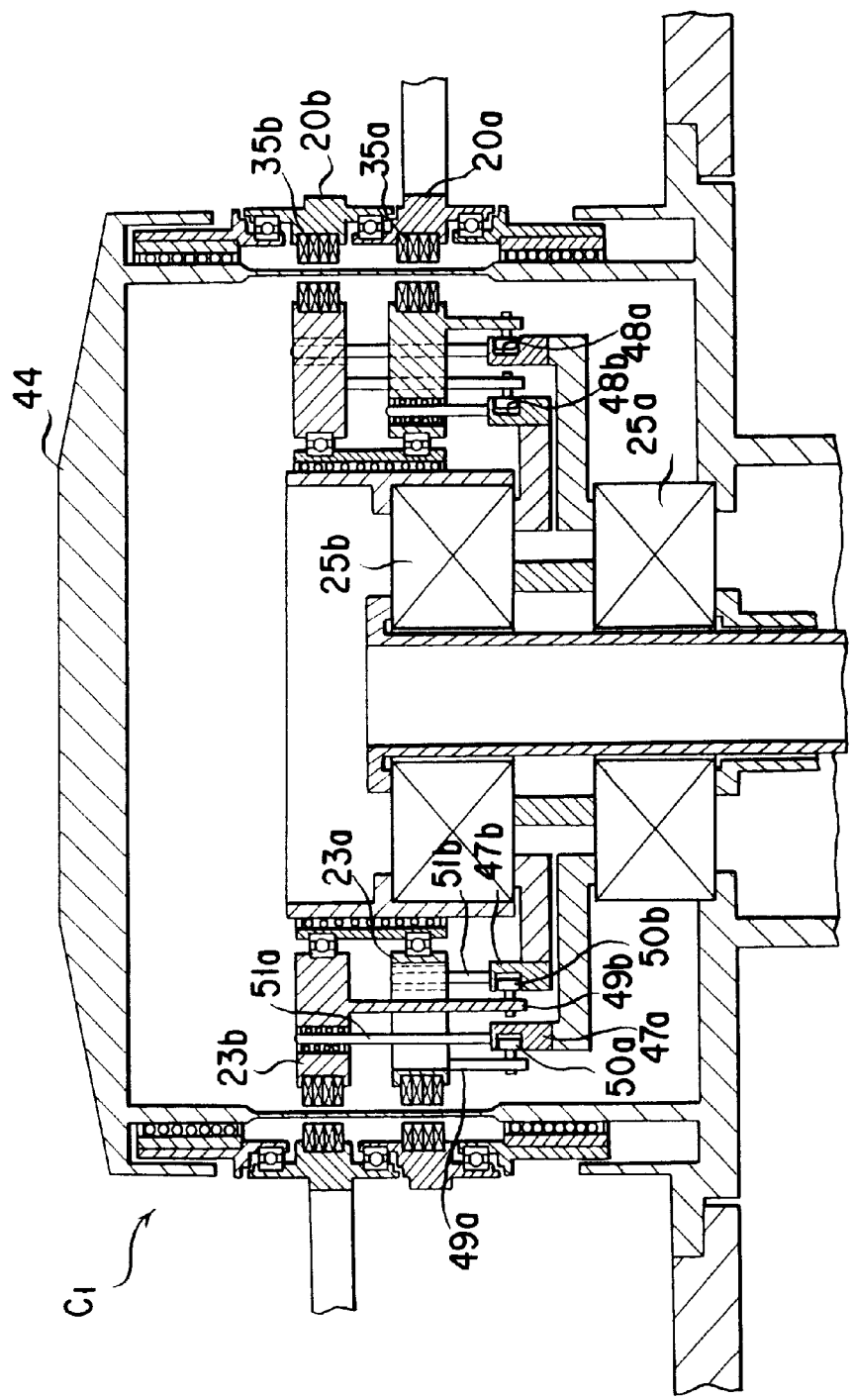
FIG. 29 is a cross sectional view showing one part of the boss section shown in FIG. 28.

FIG. 26 shows the said lower boss section C1 whose construction is substantially identical to the construction of FIG. 15 in which the said first and second disk shaped boss sections 23a and 23b are driven. It should be noted that the reference numeral and characters individually and in combination represent the same components or parts.

On the other hand, the said upper boss section C2 has a substantially same construction as the construction of the lower boss section that is located below it, and they are fastened to the said chamber cover 65 oppositely to each other.

According to this construction, each of the said transfer tables 8a and 8b is vertically displaced by driving a said electrically actuated cylinder 33 for both the said boss sections C1 and C2 and at the end of its displacement, it is arranged so as to be opposing to a said gate 6 of the said transfer chamber 1.

Figure 16:
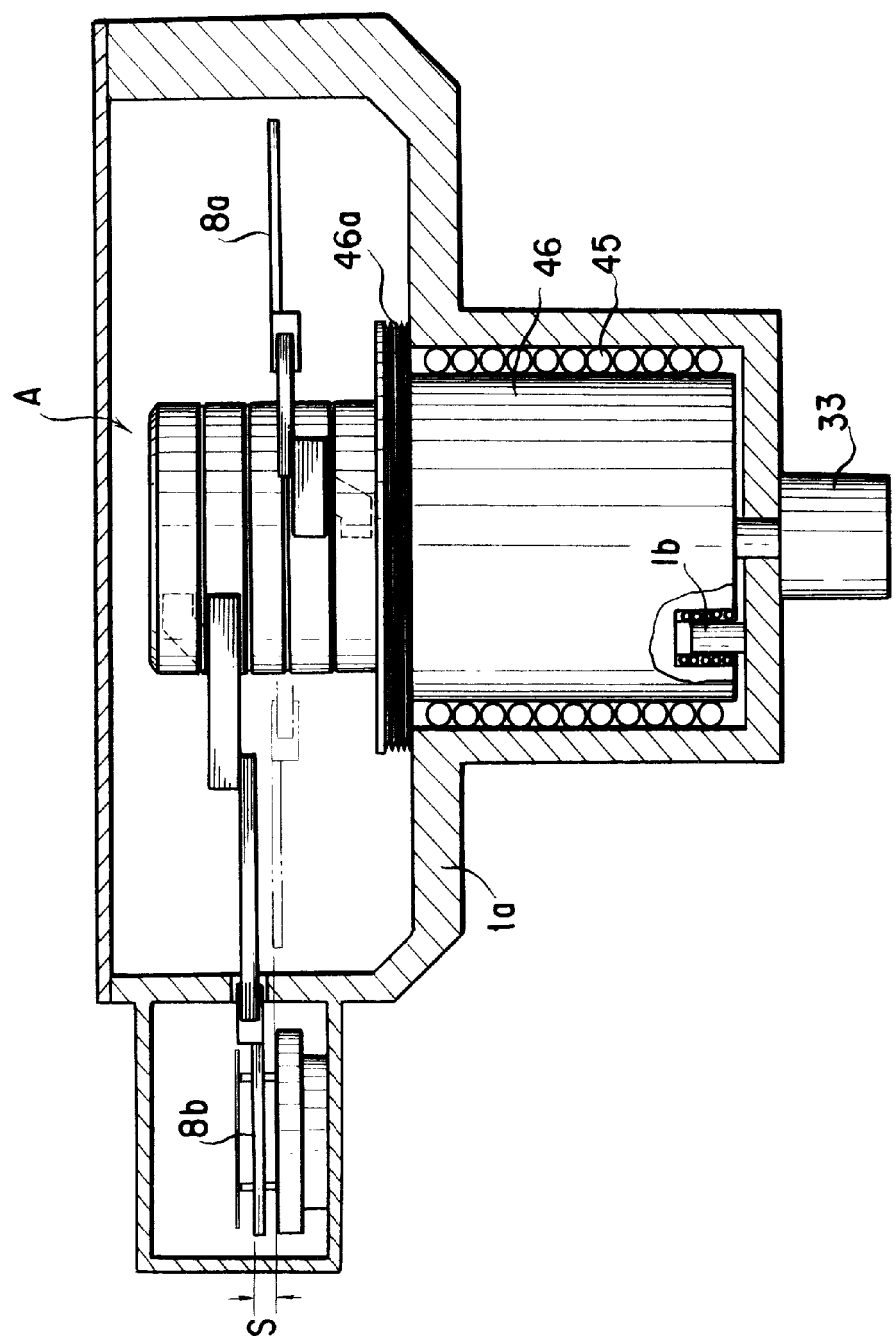
FIG. 16 is a cross sectional view showing the construction in which the whole of the bosses is rendered capable of being displaced towards the central axis of rotation.

* Each of the upper and lower boss sections or at least one thereof including a drive unit is vertically displaced in its entirety (FIG. 27):

This example corresponds to the form of FIG. 16 in which an entire boss section is vertically displaced, and has a said lower and a said upper boss section C1 and C2, including cases which contain their respective drive units, vertically displaced in their entireties, respectively, each by a said electrically actuated cylinder 33, 33. The said boss sections C1 and C2 are arranged so as to be opposing to the said frame 1a and the said chamber cover 65 of the transfer chamber 1 downwards and upwards and are vertically displaced by the said electrically actuated cylinders 33 and 33, respectively. This will allow each of the said transfer tables 8a and 8b to be opposing to a said gate 6.

Figure 19:
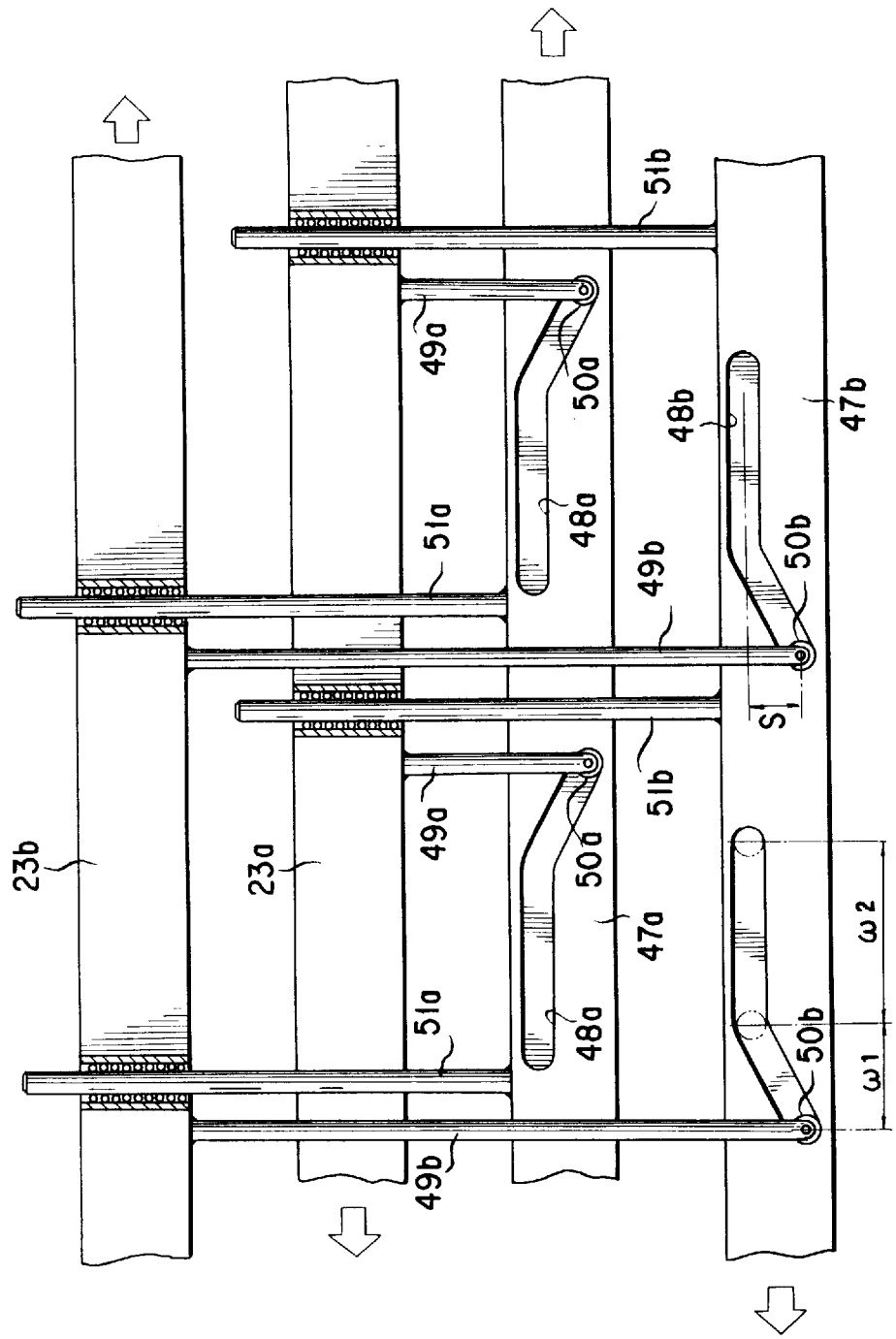
FIG. 19 is a developed explanatory view showing the essential part of an example shown in FIG. 17.

* Each of the upper and lower boss sections or at least one thereof is vertically displaced by a cam mechanism (FIGS. 28 and 29):

This example represents a construction in which the said boss section constructed in a manner as shown in FIGS. 17 to 19 is vertically divided into a first boss section comprised of the said disk shaped bosses 23a and 23b and their respective drive units and a second boss section comprised of the said disk shaped bosses 23c and 23d and their respective drive units. The drive units for driving the said disk shaped boss 23a to 23d, respectively, are constructed here in an identical fashion to that in the previous construction, and the same reference numerals and characters individually and in combination designate the same components or parts.

According to this construction, the said lower and upper boss sections C1 and C2 are vertically displaced each individually by a cam mechanism.

Further, even in the construction here in which the said upper and lower boss sections divided are provided, there may be no vertical displacement of each of the said boss sections C1 and C2. However, a portion of articulation at which a said arm and a said link are coupled together may be vertically displaced at the link side by a said extender and retractor unit 36a or a said cam mechanism 57 as shown in FIGS. 22 and 23 described previously. Alternatively, a said transfer table and a portion at which the said transfer table and a said link are coupled together may each be vertically displaced by using a displacement mechanism attached thereto.

Figure 30:
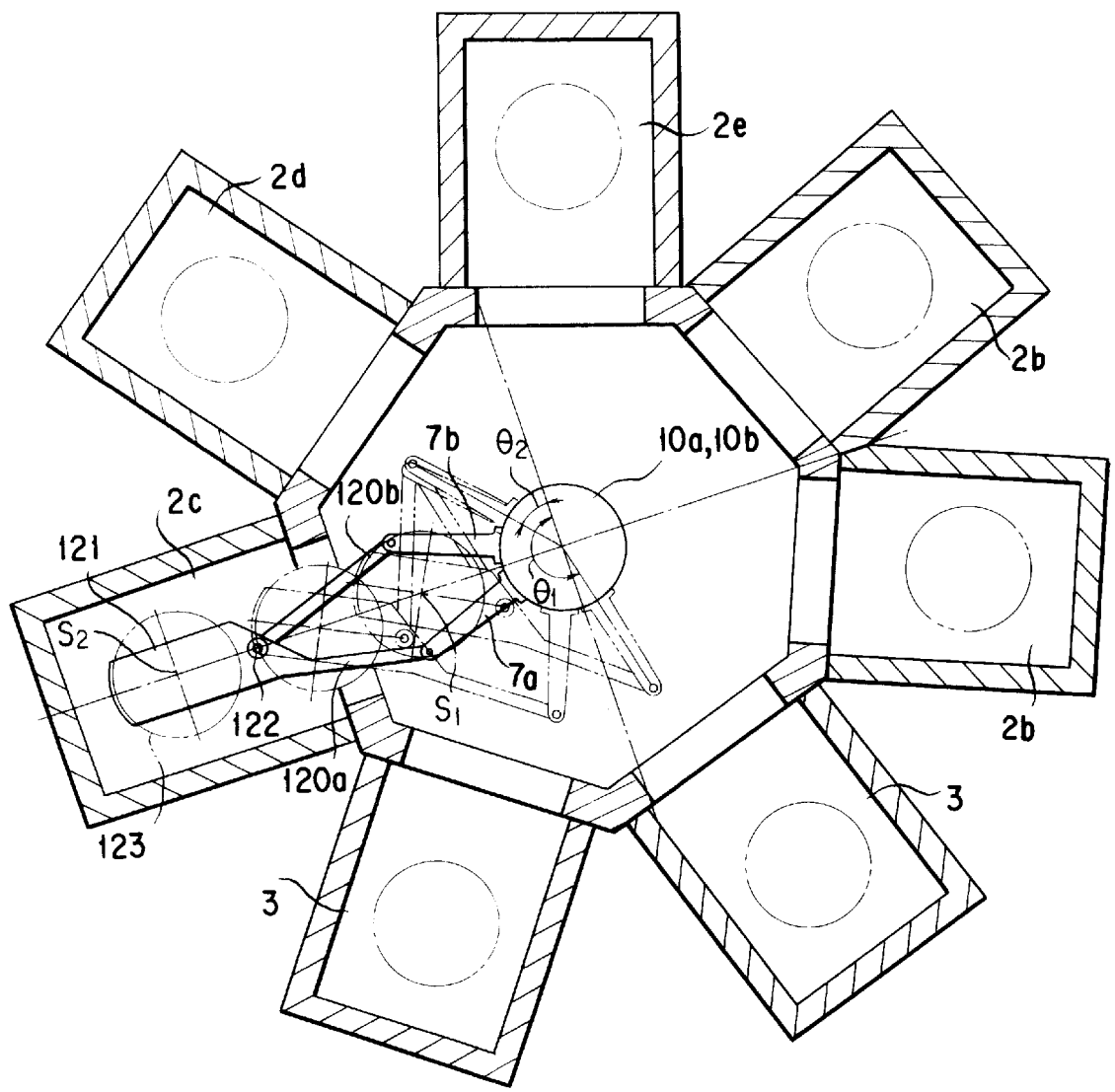
FIG. 30 is a top plan view showing another embodiment of the handling robot according to the present invention.

An explanation will now be given with respect to another embodiment of the present invention with reference to FIGS. 30 and 31.

In the explanation of this embodiment as well, it should be noted that any component or part of the construction thereof which is identical to that in the construction of the prior art is denoted by the same reference numeral and character individually or in combination and a detailed description thereof will be omitted.

The respective base ends of a first and a second link 120a and 120b are rotatably coupled to the respective leading ends of a said first and a said second arm 7a and 7b which are projected from a said first and a second ring shaped boss 10a and 10b radially thereof, respectively. And, the leading end of one link 120a of the said pair of the links 120a and 120b is constructed integrally with a transfer table 121 whereas the the leading end of the other link 120b thereof is rotatably coupled at a rotary node 122 to the said transfer table 121.

Figure 5:
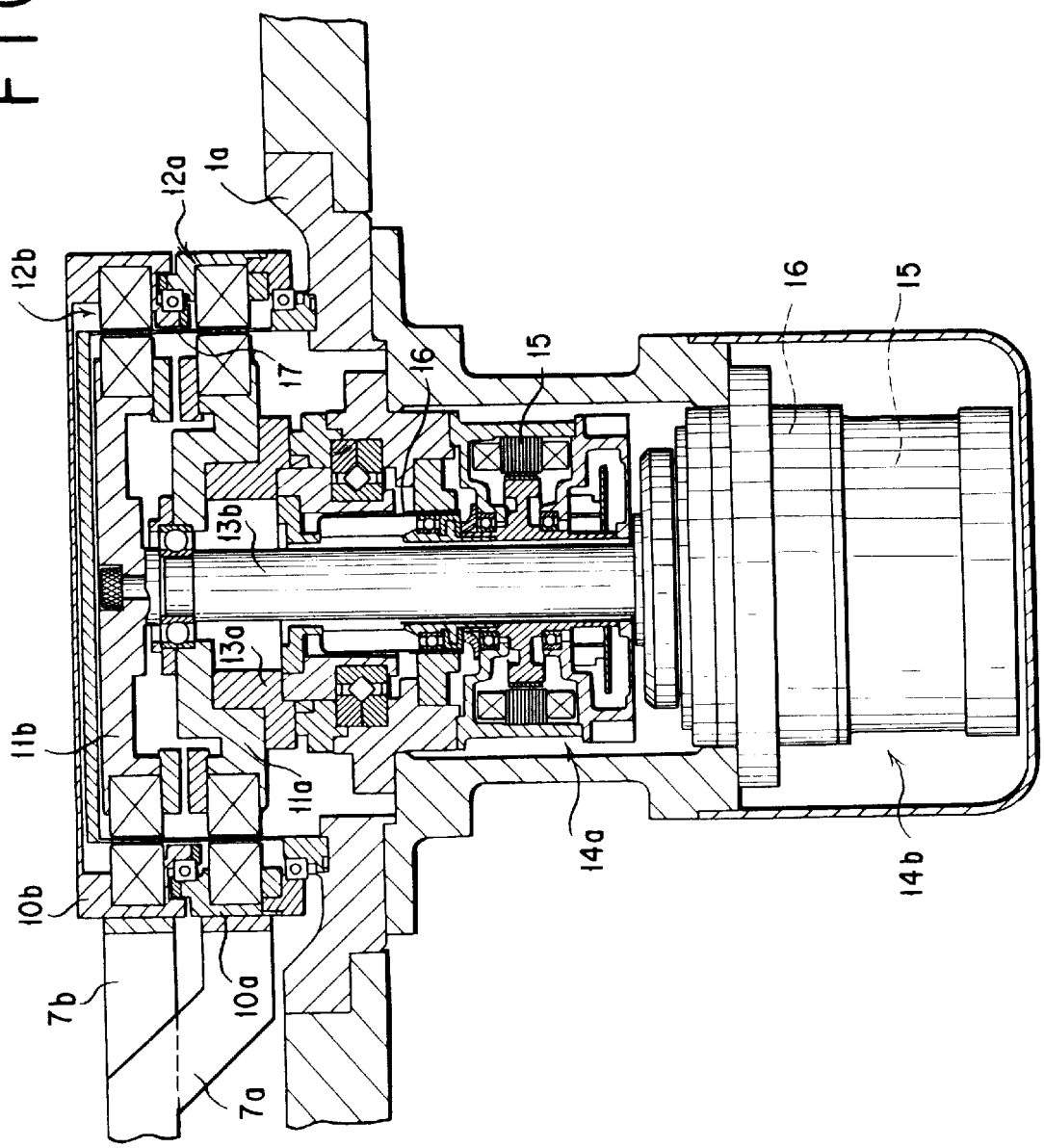
FIG. 5 is a cross sectional view illustrating an arm rotary mechanism for the conventional handling robot.
Figure 6:
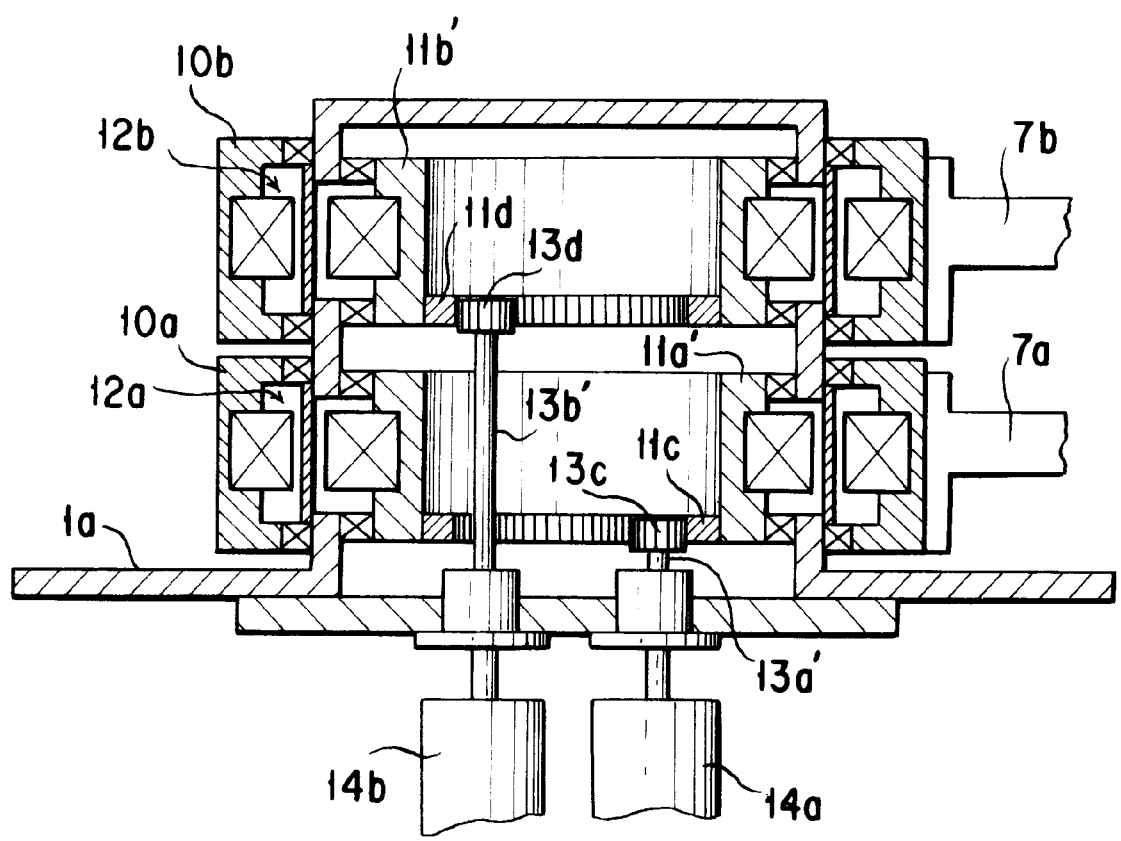
FIG. 6 is a cross sectional view illustrating another arm rotary mechanism for the conventional handling robot.
Figure 7A:
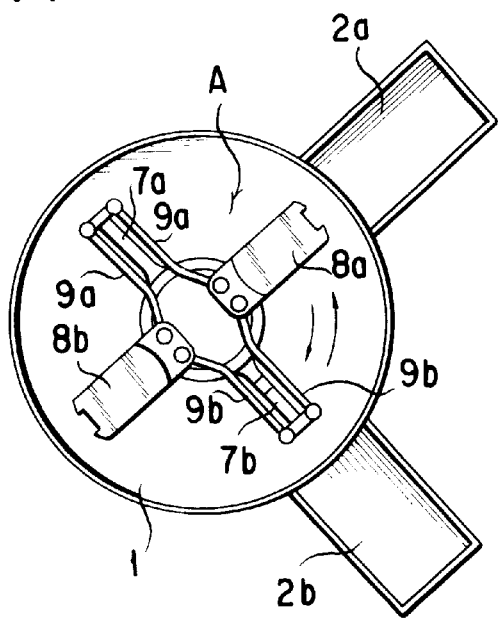
FIGS. 7A and 7B are each a functional explanatory view of the conventional handling robot.
Figure 7B:
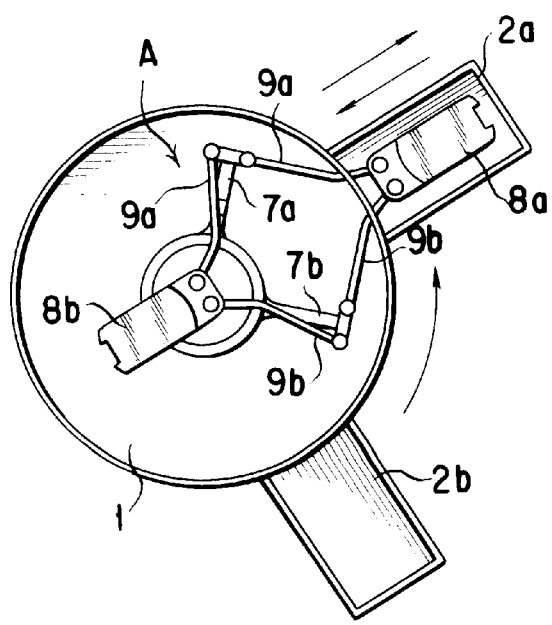
Figure 8:
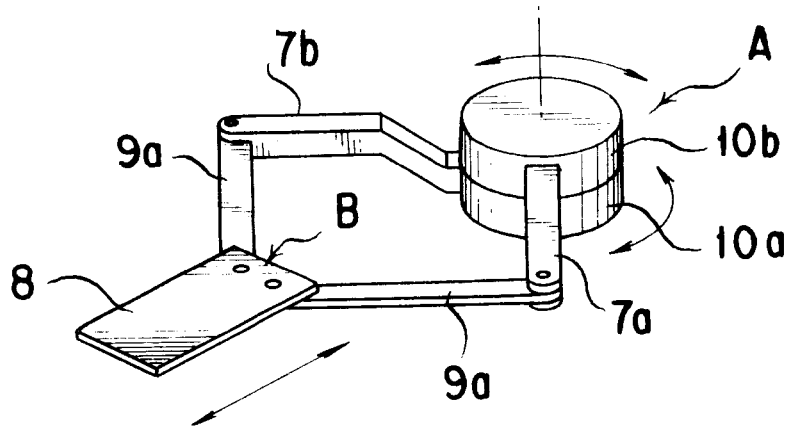
FIG. 8 is a decomposed perspective view illustrating a relationship between a transfer chamber and another conventional handling robot.
Figure 8:
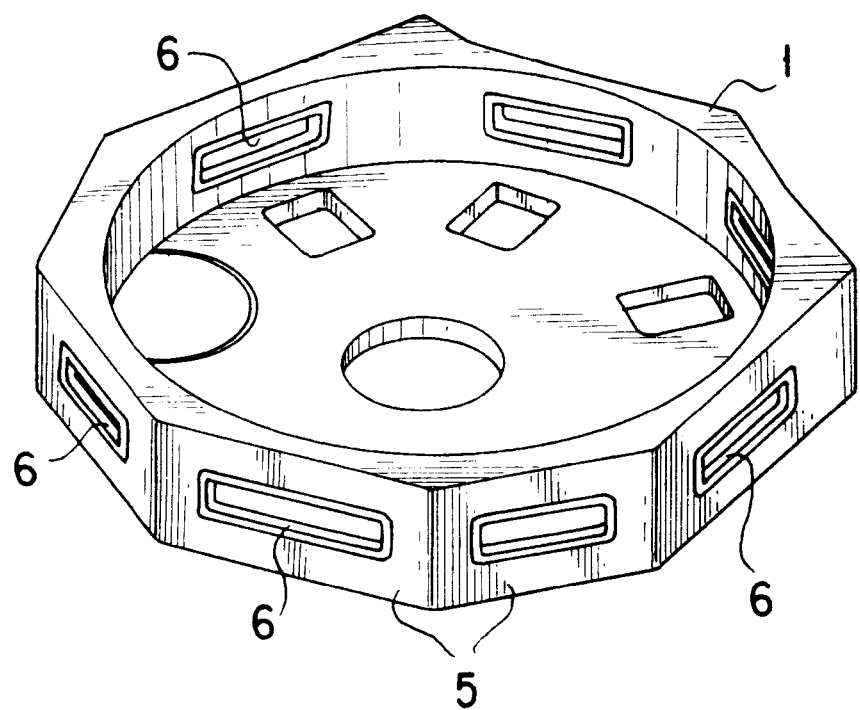

A structure for rotating the above mentioned ring shaped bosses 10a and 10b is here identical to that shown in FIG. 5 so that their respective angles of rotation may be controlled as desired by a motor unit.

In the construction mentioned above, it can be seen that by rotating the said pair of the ring shaped bosses 10a and 10b in their respective directions in which the said pair of the arms 7a and 7b approach each other, the said transfer table 121 will be pushed out by the action of the said arms 7a and 7b and the said links 120a and 120b so that it may be projected from the inside of the said transfer chamber 1 via a said gate 6 into a desired one of the said stations.

And, if the said pair of the ring shaped bosses 10a and 10b are rotated from this state in their respective directions in which the said arms 7a and 7b depart from each other, the said transfer table 120 will be sunk or retracted into the said transfer chamber 1 and this operation will then cause a wafer 123 that is mounted on the said transfer table 121 to be delivered and conveyed over between the said transfer chamber 1 and the said one station.

Then, since the said transfer table 121 is made structurally integral with the said one link 12a, the attitude of the said transfer table 121 that is both projected and sunk or retracted will be made identical to the attitude of the above mentioned link 120a. For this reason, the respective angles of rotation θ 1 and θ 2 of the said arms 7a and 7b from their reference position for reciprocating the said transfer table 121 over between its most sunk or retracted position S1 and its most projected position S2 as shown in FIG. 30 are varied from each other. More specifically, the said motor unit is controlled so that the said respective angle of rotation θ 1 and θ 2 of the said pair of the arms 7a and 7b from their reference position may be such angles of rotation that the said transfer table 121 can be displaced so as to follow a trajectory extending from the said most sunk or retracted position S1 in the said transfer chamber 1 through the said gate 6 to the said most projected position that is a predetermined position in the said one station.

Then, a method of controlling the said angles of rotation θ 1 and θ 2 of the above mentioned pair of the arms 7a and 7b from a said reference position will be explained based on the reference symbols shown in FIG. 31.

Figure 31:
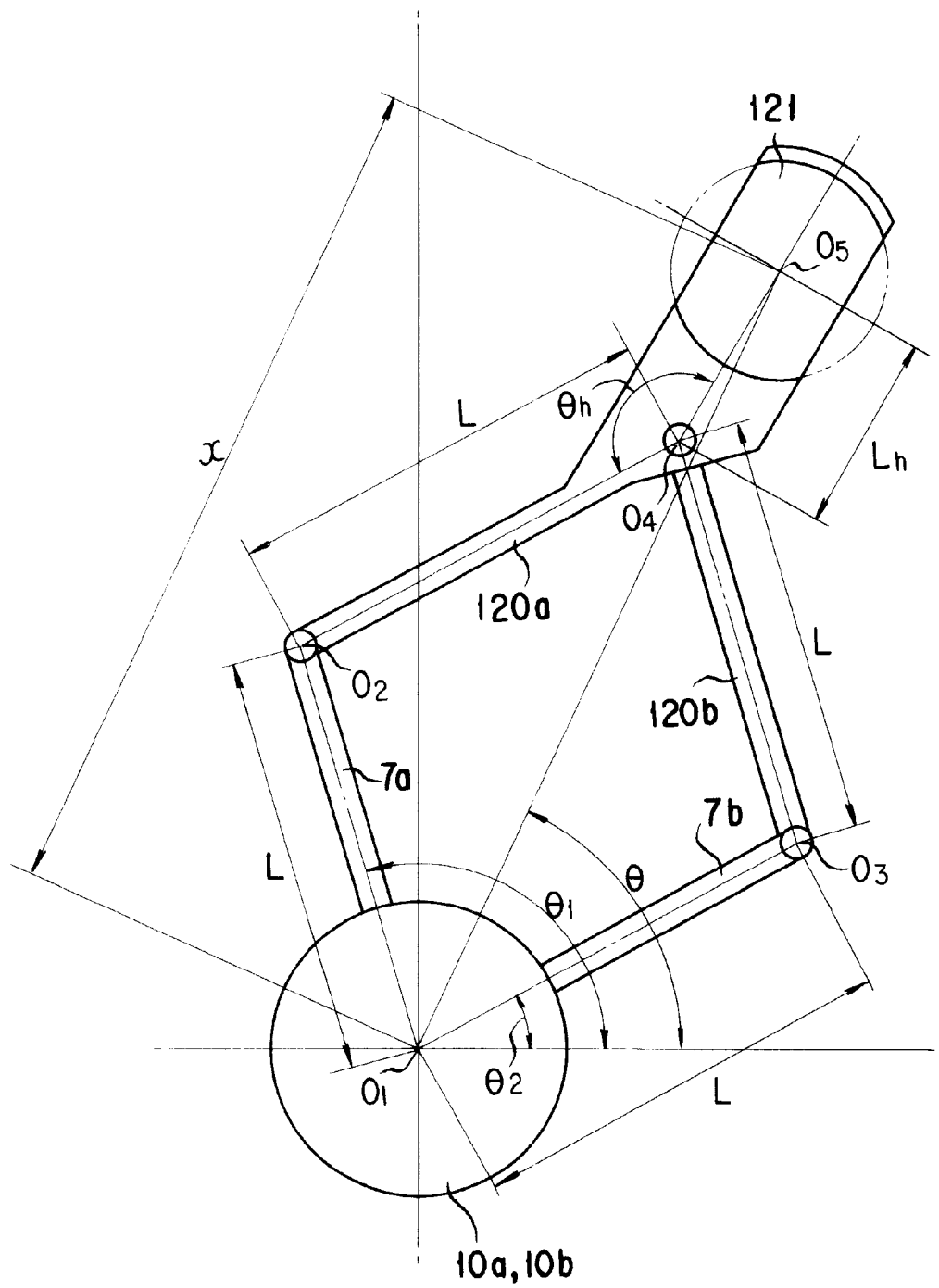
FIG. 31 is an explanatory view illustrating the sizes and the angles of rotation of an arm and a link with respect to a transfer table.

Now, with reference to FIG. 31, if it is assumed that the turning center of the handling robot is represented by 01, the points at which the said arms 7a and 7b and the said links 120a and 120b are coupled together, respectively, are represented by 02 and 03, respectively, the point at which the one link 120b and the said transfer table 121 are coupled together is represented by 04, the center of the said transfer table 121 is represented by 05, the said arms 7a and 7b and the said links 120a and 120b have their respective lengths 01–02, 01–03, 02–04 and 03–04 which are identical to one another and represented by L, the distance between the point 04 at which the said one link 120b and the said transfer table 121 are coupled together and the center 05 of the said transfer table 121 is represented by Lh and the angle of attitude of the said transfer table 121 with respect to the said link 120a that is integral therewith is represented by θ h, it has been found that the angles of rotation θ 1 and θ 2 of the said pair of the arms 7a and 7b which are measured from the said reference position and are required to displace the said center 05 of the transfer table 121 from the said turning center 01 of the handling robot over a distance x to a position that corresponds to an angle θ from the said reference position are expressed by the following equations:

$$\theta_1 = \theta + \frac{\theta_\Delta}{2} - \arctan\left(\left(L_h \sin\theta_h + \frac{\theta_\Delta}{2}\right) \Big/ \left(2L\cos\frac{\theta_\Delta}{2} - L_h\cos\theta_h + \frac{\theta_\Delta}{2}\right)\right)$$

$$\theta_2 = \theta - \frac{\theta_\Delta}{2} - \arctan\left(\left(L_h \sin\left(\theta_h + \frac{\theta_\Delta}{2}\right)\right) \Big/ \left(2L\cos\frac{\theta_\Delta}{2} - L_h\cos\theta_h + \frac{\theta_\Delta}{2}\right)\right)$$

where $$\theta_\Delta = \theta_1 - \theta_2$$
$$= \arccos((-(L - L_h\cos\theta_h) \cdot$$
$$(-x^2 + 2L^2 + L_h^2 - 2LL_h\cos\theta_h) -$$
$$L_h\sin\theta_h\sqrt{4x^2L^2 - (2LL_h\cos\theta_h + x^2 - L_h^2)^2}\,)\Big/$$
$$(2L(L^2 - 2LL_h\cos\theta_h + L_h^2)))$$

If the said transfer table 121 is moved so as to be projected from the inside of the said transfer chamber 1 over the distance x to a predetermined position within a said selected station, it can thus be seen that the motor unit should be controlled so that respective angles of rotation θ 1 and θ 2 may meet the above identified equation.

If the said pair of the arms 7a and 7b are rotated in an identical direction in the state in which the said transfer table 121 has been sunk or retracted, the said transfer table 121 will be operatively turned in the said transfer chamber 1 so as to be opposing to another of the said stations.

Whilst in the above mentioned embodiment the said transfer table 121 is constructed so as to be structurally integral with the said one link 120a, this is, of course, not a limitation. Thus, alternatively, the said transfer table 121 and the said link 120a may be made separately and then be coupled together by a bolt or the like so as to be integral with each other.

Figure 4A:
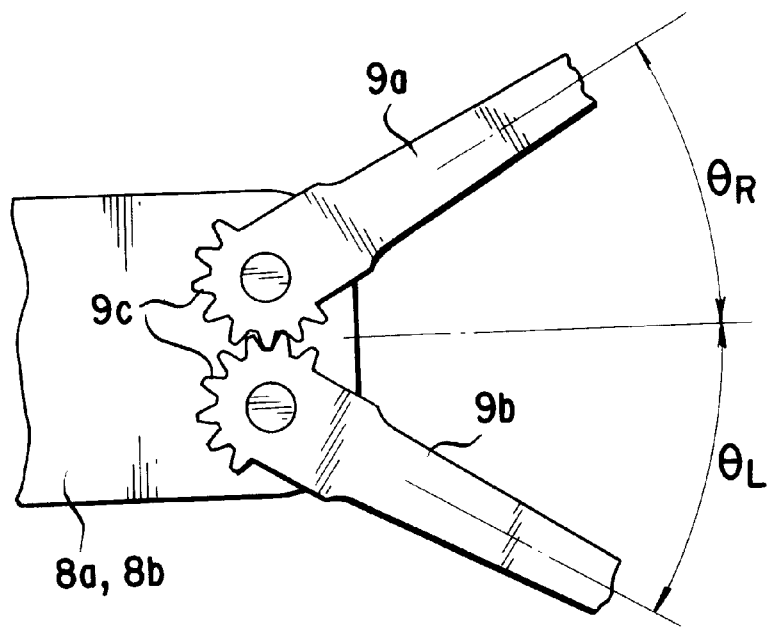
FIGS. 4A and 4B are explanatory views, each showing a transfer table attitude regulating mechanism.
Figure 4B:
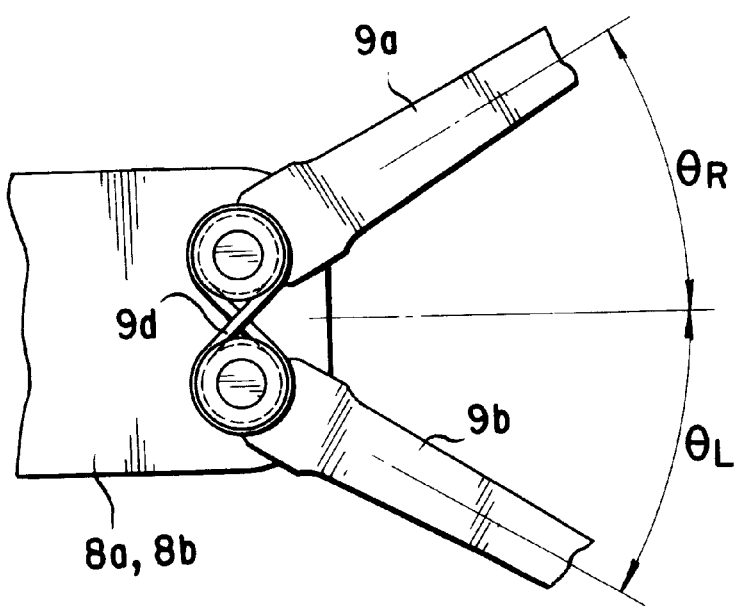

As set out in the foregoing description, it will be appreciated that by permitting the said transfer table 121 and the said pair of the links 120a and 120b to be coupled together at a single rotary node 122, a dust can be extremely much less frequently produced in the present invention as compared with the prior art in which the two rotary nodes has been required as in the transfer table attitude regulating mechanism B shown in FIGS. 4A and 4B and a gear or belt coupling has been essential. In addition, with the number of rotary nodes being reduced to only one, there can be no loosening adversely influencing on an operation of the handling robot according to the present invention, which has not otherwise be avoidable with the two rotary nodes which have been essential in the prior art.

While the present invention has hereinbefore been described with respect to certain illustrative embodiments thereof, it will readily be appreciated by a person skilled in the art to be obvious that many alterations thereof, omissions therefrom and additions thereto can be made without departing from the essence and the scope of the present invention. Accordingly, it should be understood that the present invention is not limited to the specific embodiments thereof set out above, but includes all possible embodiments thereof that can be made within the scope with respect to the features specifically set forth in the appended claims and encompasses all equivalents thereof.

What is claimed is:

1. A handling robot, characterized in that:
   at least four bosses are disposed in a transfer chamber so as to be coaxial to one another and rotatable independently of one another and to be deviated in their positions towards the axis of a center of rotation;
   each of said bosses is provided with an arm, respectively;
   a link is coupled to each of such arms, respectively;
   two of said bosses which are adjacent to each other in an axial direction are constituted in a pair;
   a transfer table is coupled via a transfer table attitude regulating mechanism to the respective leading ends of each pair of such links which are in turn coupled to each arm of said each pair of the bosses to provide a plurality of such transfer tables which are arranged so as to be deviated in their positions towards said axis of the center of rotation; and
   an independent drive source is coupled to each of said bosses, respectively.

2. A handling robot, as set forth in claim 1, characterized in that:
   a first boss section that comprises a first pair of said bosses arranged in said axial direction and a first pair of drive units coupled respectively to said bosses is separately configured from a second boss section that comprises a second pair of said bosses arranged in said axial direction and a second pair of drive units coupled respectively to said bosses;
   said first and second boss sections are arranged so as to be opposing to each other and in such a manner that said bosses may be made coaxial to one another; and
   said plurality of the transfer tables are arranged between said first and second boss sections so as to be deviated in their positions towards said axis of the center of rotation.

3. A handling robot, as set forth in claim 2, characterized in that:
   a said boss section including a said drive unit is supported so as to be displaceable towards said axis of the center of rotation with respect to a frame of said transfer chamber; and
   a linear actuator is coupled to said boss section.

4. A handling robot, as set forth in claim 2, characterized in that:
   at least one of said first boss section and said second boss section is supported so as to be displaceable towards said axis of the center of rotation with respect to a frame of said transfer table; and
   a linear actuator is coupled to said at least one boss section.

5. A handling robot, as set forth in claim 2, characterized in that:
   inside of said bosses which are ring shaped, there are different bosses which are disk shaped and are supported by a frame of said transfer chamber so as to be each rotatable;
   each of said disk shaped bosses and each of said ring shaped bosses are coupled together via a magnetic coupling so as to be coupled and decoupled with each other in a rotary direction;
   each of said disk shaped bosses is provided inside thereof with a speed reduction gear;
   said reduction gear that is provided inside of each such disk shaped boss has an input member thereof to which is coupled a rotary shaft, respectively;
   such rotary shafts are arranged so as to be coaxial about said center of rotation and so as to extend towards one side of said axis of the center of rotation; and
   each of said rotary shafts is coupled to a motor, respectively.

6. A handling robot, as set forth in claim 2, characterized in that:
   at least one pair of said bosses which are ring shaped and said drive unit for driving said ring shaped bosses are rendered capable of being displaced towards said axis of the center of rotation.

7. A handling robot, as set forth in claim 2, characterized in that:
   at a section at which a said transfer table and a said link coupled to said transfer table are coupled together, there is provided a displacement mechanism for displacing said transfer table towards said axis of the center of rotation with respect to said link.

8. A handling robot, as set forth in claim 2, characterized in that:
   at a section at which a said link and a said arm are coupled together, there is provided a displacement mechanism for displacing said link towards said axis of the center of rotation with respect to said arm.

9. A handling robot, as set forth in claim 2, characterized in that:
   at a section at which a said link and a said arm are coupled together, there are provided a cam shaft having a cam portion and a cam engagement member fitted with said cam portion so that they may be coupled to one of said link and said arm; and
   said cam portion is so configured that when each pair of said arms are rotated in their respective directions which are opposite to each other, said pair of the links may be displaced towards an axially identical direction.

10. A handling robot, as set forth in claim 1, characterized in that:
    at a section at which a said link and a said arm are coupled together, there is provided a displacement mechanism for displacing said link towards said axis of the center of rotation with respect to said arm.

11. A handling robot, as set forth in claim 1, characterized in that:
    inside of said bosses which are ring shaped, there are different bosses which are disk shaped and are supported by a frame of said transfer chamber so as to be each rotatable;
    each of said disk shaped bosses and each of said ring shaped bosses are coupled together via a magnetic coupling so as to be coupled and decoupled with each other in a rotary direction;

each of said disk shaped bosses is provided inside thereof with a speed reduction gear;

said reduction gear that is provided inside of each such disk shaped boss has an input member thereof to which is coupled a rotary shaft, respectively;

such rotary shafts are arranged so as to be coaxial about said center of rotation and so as to extend towards one side of said axis of the center of rotation; and each of said rotary shafts is coupled to a motor, respectively.

12. A handling robot, as set forth in claim 11, characterized in that:

such motors are disposed in series with one another in the direction of said axis of the center of rotation of said disk shaped bosses; and each of said motors has an output member thereof that is directly coupled to each of said rotary shafts, respectively.

13. A handling robot, as set forth in claim 11, characterized in that:

each of a said ring shaped boss and a said disk shaped boss which are opposing to each other via said magnetic coupling is rendered capable of being displaced towards said axis of the center of rotation;

a pair of boss sections of said disk shaped bosses which are adjacent to each other in said axial direction are coupled together by a said speed reduction gear;

a cam ring is provided coaxially with each of said disk shaped bosses of said boss sections;

a cam engagement member that is provided for each of said disk shaped bosses is engaged with a cam portion that is provided in said cam ring; and said cam is configured so that when said pair of the disk shaped bosses are rotated oppositely to each other, they may be displaced as a whole towards said axial direction.

14. A handling robot, as set forth in claim 11, characterized in that:

a pair of said ring shaped bosses which are coupled to at least one of said plurality of the transfer tables and a pair of said disk shaped bosses which are positioned inside of said pair of the ring shaped bosses are each supported so as to be displaceable towards said axis of the center of rotation;

each of said ring shaped bosses and each of said disk shaped bosses which are opposing to each other are coupled together by a magnetic coupling such as that of a linear rotary type which is made capable of transmitting both a force of rotation and a force of straight advancement in an axial direction; and said inside positioned pair of the disk shaped bosses are coupled to a linear actuator for displacing said pair of the disk shaped bosses.

15. A handling robot, as set forth in claim 11, characterized in that:

such motors are disposed in parallel to one another around said center of rotation of said disk shaped bosses; and each of said motors and each of said rotary shafts are coupled together by a power transmission means such as a timing belt.

16. A handling robot, as set forth in claim 1, characterized in that:

at least one pair of said bosses which are ring shaped and said drive unit for driving said ring shaped bosses are rendered capable of being displaced towards said axis of the center of rotation.

17. A handling robot, as set forth in claim 1, characterized in that:

at a section at which a said transfer table and a said link coupled to said transfer table are coupled together, there is provided a displacement mechanism for displacing said transfer table towards said axis of the center of rotation with respect to said link.

18. A handling robot, as set forth in claim 1, characterized in that:

at a section at which a said link and a said arm are coupled together, there are provided a cam shaft having a cam portion and a cam engagement member fitted with said cam portion so that they may be coupled to one of said link and said arm; and said cam portion is so configured that when each pair of said arms are rotated in their respective directions which are opposite to each other, said pair of the links may be displaced towards an axially identical direction.

19. A handling robot, as set forth in claim 1, characterized in that:

at least one of said plurality of the transfer tables is rendered capable of being displaced towards said axis of the center of rotation.

* * * * *